(12) United States Patent
Ling et al.

(10) Patent No.: US 8,705,298 B2
(45) Date of Patent: Apr. 22, 2014

(54) METHOD AND APPARATUS FOR MEMORY FAULT TOLERANCE

(71) Applicants: Curtis Ling, Carlsbad, CA (US); Vadim Smolyakov, Mississauga (CA); Timothy Gallagher, Encinitas, CA (US); Glenn Gulak, Toronto (CA)

(72) Inventors: Curtis Ling, Carlsbad, CA (US); Vadim Smolyakov, Mississauga (CA); Timothy Gallagher, Encinitas, CA (US); Glenn Gulak, Toronto (CA)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 13/758,187

(22) Filed: Feb. 4, 2013

(65) Prior Publication Data

US 2013/0141995 A1 Jun. 6, 2013

Related U.S. Application Data

(60) Division of application No. 13/285,864, filed on Oct. 31, 2011, which is a continuation-in-part of application No. 13/269,416, filed on Oct. 7, 2011, now abandoned.

(60) Provisional application No. 61/487,250, filed on May 17, 2011.

(51) Int. Cl.
*G11C 29/00* (2006.01)

(52) U.S. Cl.
USPC .......................................................... 365/200

(58) Field of Classification Search
None
See application file for complete search history.

(56) References Cited

U.S. PATENT DOCUMENTS

| 5,909,404 | A * | 6/1999 | Schwarz ........................ 365/201 |
| 6,202,180 | B1 * | 3/2001 | Nose ............................. 714/718 |
| 8,448,042 | B2 | 5/2013 | Spraul | |
| 2003/0182491 | A1 * | 9/2003 | Chudnovsky et al. ............ 711/5 |
| 2004/0117723 | A1 | 6/2004 | Foss | |
| 2006/0171210 | A1 * | 8/2006 | Nagashima et al. ...... 365/189.01 |
| 2010/0115376 | A1 * | 5/2010 | Shalvi et al. .................. 714/763 |

OTHER PUBLICATIONS

Int'l Search Report for PCT/US2012/023975 dated May 23, 2012.

* cited by examiner

*Primary Examiner* — Huan Hoang
*Assistant Examiner* — James G Norman
(74) *Attorney, Agent, or Firm* — McAndrews, Held & Malloy, Ltd.

(57) ABSTRACT

One or more circuits may include an array of memory cells corresponding to a particular memory address. The one or more circuits may be operable to discover a location of a faulty memory cell in the array of memory cells. The one or more circuits may be operable to arrange the order in which the bits of a data block are stored to said array of memory cells based, at least in part, on said discovered location of said faulty memory cell.

10 Claims, 21 Drawing Sheets

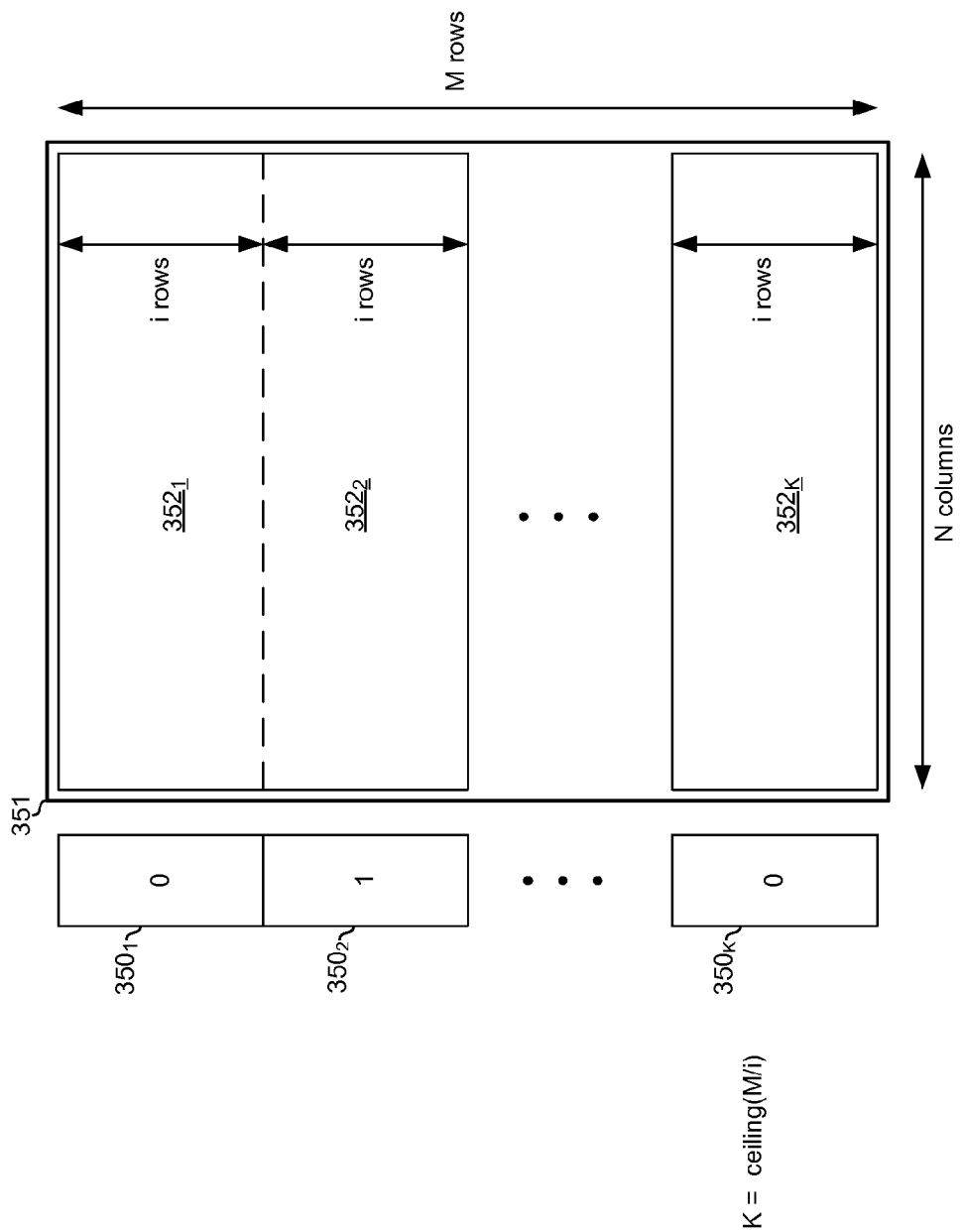

METHOD AND APPARATUS FOR MEMORY FAULT TOLERANCE

CLAIM OF PRIORITY

This patent application is a divisional of U.S. patent application Ser. No. 13/285,864 filed on Oct. 31, 2011, and is directed to a non-elected species of U.S. patent application Ser. No. 13/285,864. U.S. patent application Ser. No. 13/285,864 is a continuation-in-part of U.S. patent application Ser. No. 13/269,416 filed on Oct. 7, 2011. This patent application also makes reference to, claims priority to, and claims benefit from U.S. Provisional Patent Application Ser. No. 61/487,250 filed on May 17, 2011.

Each of the above-referenced applications is hereby incorporated herein by reference in its entirety.

FIELD OF THE INVENTION

Certain embodiments of the invention relate to memory circuits. More specifically, certain embodiments of the invention relate to a method and apparatus for memory fault tolerance.

BACKGROUND OF THE INVENTION

Faulty memory cells are inevitable in any practical integrated circuit comprising a significant amount of memory. The faulty cells are the result of the ever-increasing design constraints imposed on modern integrated circuits. Conventional methods of dealing with faulty memory cells are overly costly and/or impractical for many applications.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

An apparatus and/or method is provided for memory fault tolerance, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF THE DRAWINGS

FIG. 3D illustrates an exemplary mapping between a fault register and memory cells managed via the fault register.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or." For example, "x and/or y" means any element of the three-element set $\{(x), (y), (x, y)\}$. Similarly, "x, y, and/or z" means any element of the seven-element set $\{(x), (y), (z), (x, y), (x, z), (y, z), (x, y, z)\}$. As utilized herein, the term "module" refers to functions than can be implemented in hardware, software, firmware, or any combination of one or more thereof. As utilized herein, the term "exemplary" means a non-limiting example, instance, or illustration.

Figure 1A:
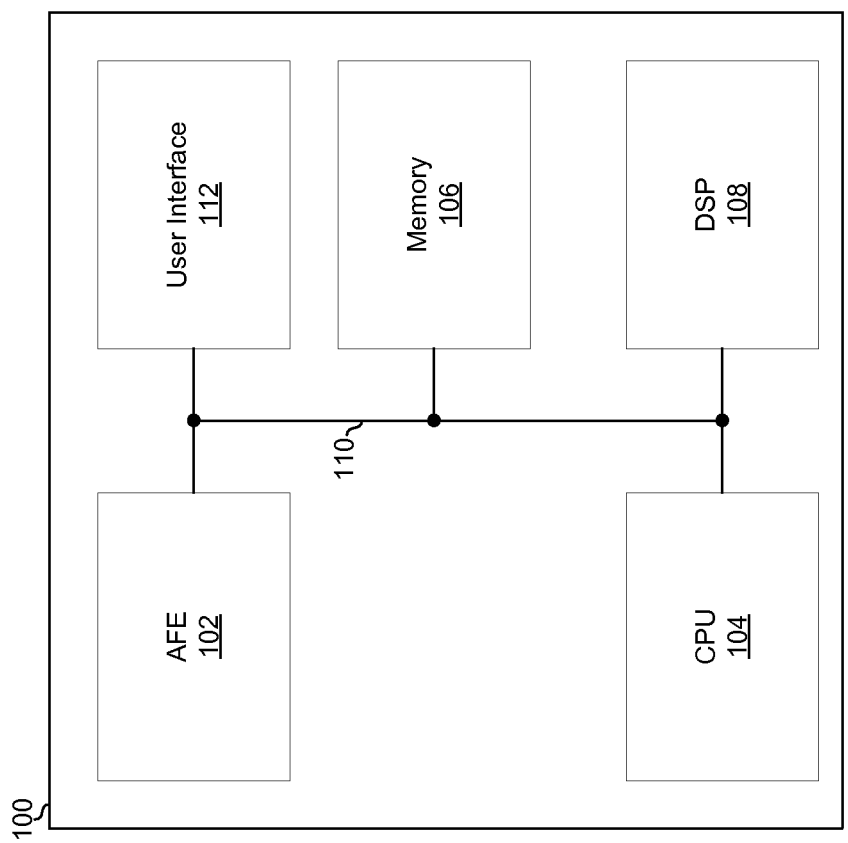
FIG. 1A depicts an exemplary device operable to mitigate the impact of faulty memory cells.

FIG. 1A depicts an exemplary device operable to mitigate the impact of faulty memory cells. Referring to FIG. 1A, there is shown circuitry of an exemplary electronic device 100 which comprises an analog front-end (AFE) module 102, a central processing unit (CPU) 104, a memory module 106, a digital signal processing module (DSP) 108, a user interface module 112, and a signal bus 110.

The AFE 102 may be operable to transmit and/or receive information utilizing any suitable communication protocol(s). In an exemplary embodiment of the invention, the AFE 102 may be operable to perform analog-domain processing operations that enable transmission and/or reception of orthogonal frequency division multiplexed (OFDM) signals.

The CPU 104 may be operable to execute instructions (e.g., an operating system) to control operations of the device 100. For example, the CPU 104 may generate control signals for configuring the device 100, and controlling operation of the AFE 102, the memory 106, and the DSP 108.

The memory 106 may comprise a plurality of memory cells which may be arranged into one or more rows and one or more columns. The memory may comprise any suitable type of volatile and/or non-volatile memory such as SRAM, DRAM, ROM, EEPROM, MRAM, FeRAM, and Flash. An exemplary structure of the memory 106 is described below with respect to FIGS. 2-3B.

The DSP 108 may be operable to perform digital signal processing algorithms and functions in accordance with one or more communication standards. For example, the DSP 108 may be operable to perform digital filtering, constellation mapping, constellation demapping, interleaving, deinterleaving, and error correction. In an exemplary embodiment of the invention, the DSP 108 may be operable to perform digital-domain processing functions that enable transmission and/or reception of orthogonal frequency division multiplexed (OFDM) signals.

The bus 110 may comprise data lines, address lines, and/or control lines. For example, the signal bus 110 may comprise one or more N-bit data busses, and a plurality of control lines such as read enable and write enable signals conveyed to the memory 106.

The user interface 112 may receive input from a user of the device 100 and provide output to the user of the device 100. For example, the user interface 112 may comprise a touchscreen, keyboard, and/or other input device, and may comprise an LCD, speakers, and/or other output device.

In an exemplary receive operation, the AFE 102 may receive an RF signal, process the received signal in the analog domain to generate a baseband signal, digitize the baseband signal, and output the baseband signal to the DSP 108 via the signal bus 110. The DSP 108 may process the baseband signal to recover information contained in the baseband signal. During processing of the baseband signal, the DSP 108 may read and write to the memory 106. The recovered information may then be conveyed to the user interface 112 for output to a user of the device.

In an exemplary transmit operation, data to be transmitted may be read from memory 106 and conveyed to the DSP 108. The DSP 108 may process the data to generate a baseband signal in accordance with one or more communication standards. In generating the baseband signal, the DSP 108 may read from and write to the memory 106. The generated baseband signal may be conveyed to the AFE 102 where it may be converted to an analog representation, further processed, and transmitted onto a physical medium.

Figure 1B:
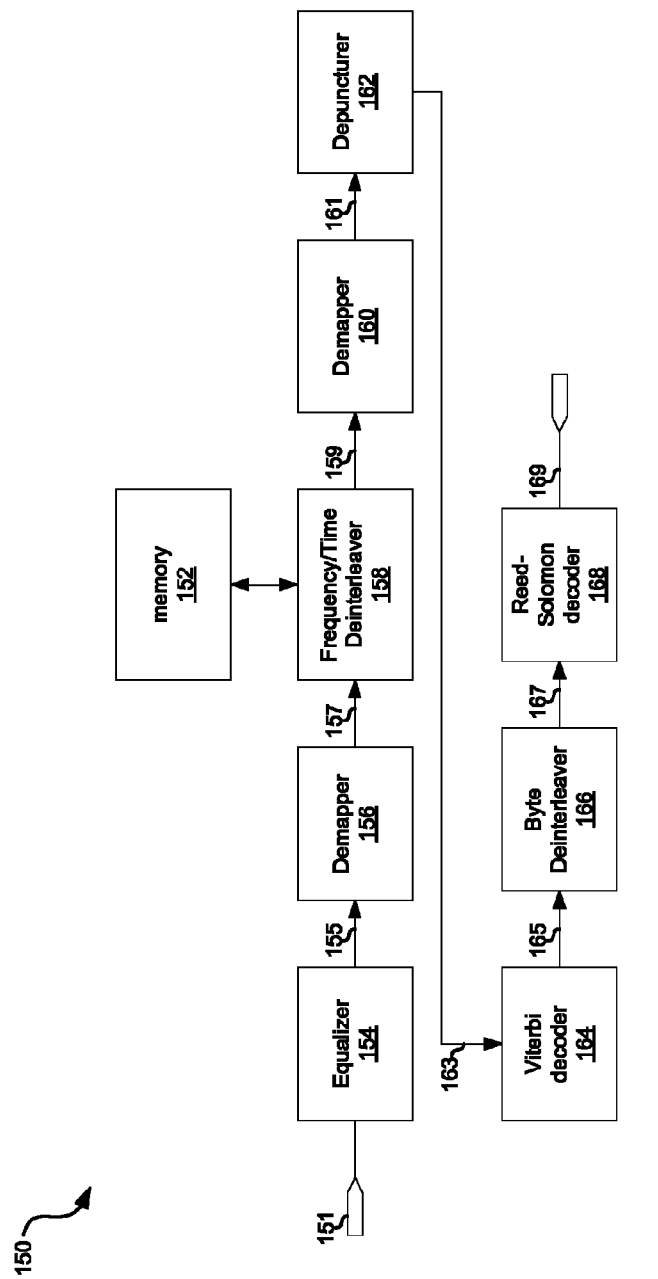
FIG. 1B depicts a portion of an exemplary receiver which, through use of the present invention, can achieve satisfactory performance even when utilizing an array of memory cells that has more than a correctable number of faulty memory cells.

FIG. 1B depicts a portion of an exemplary receiver which, through use of the present invention, can achieve satisfactory performance even when utilizing an array of memory cells that has more than a correctable number of faulty memory cells.

As utilized herein, an "array" of memory cells may refer to a group of memory cells corresponding to a particular address (a particular value on the address bus 208). Thus, the memory 200 may be referred to as "array-addressable." For example, if the memory 200 utilized 8-bit arrays, it may be referred to as byte-addressable. Similarly, if the memory 200 utilized X-bit arrays (X being an integer), with each array corresponding to an X-bit word of memory, the memory 200 may be referred to as word-addressable.

The depicted portion of the receiver 150 comprises a memory module 152, an equalizer module 154, demapper modules 156 and 160, deinterleaver module 158, depuncturer module 162. Viterbi decoder module 164, byte deinterleaver module 166, Reed-Solomon decoder module 168. The depicted portion of the receiver 150 may be implemented by, for example, a DSP such as the DSP 108 of FIG. 1A.

Although the memory module 152 is depicted as being utilized by only the deinterleaver module 158, other modules of the receiver 150 may also read and/or write to the memory module 152 and, in doing so, may take advantage of aspects of the present invention to improve performance and/or reduce cost and/or power consumption. In addition, other modules of the receiver 150 may have their own memories that may or may not interface to the bus 110 and may comprise and/or utilize aspects of the invention.

In operation, a received digital baseband signal 151 may be received from the AFE 102. The equalizer 154 may process the signal 151 to adjust the levels of various frequency components of the signal 151 to generate the signal 155. The demapper 156 may translate symbols of the signal 155 to groups of one or more bits of the signal 157. The deinterleaver 158 may deinterleave the groups of bits of the signal 157 to generate the signal 159. The memory 152 may be utilized for buffering bits of the signal(s) 157 and/or 159 during the deinterleaving. The demapper 160 may translate groups of bits of the signal 159 to groups of bits of the signal 161. The depuncturer 162 may insert bits into the signal 161 to generate the signal 163. The Viterbi decoder 164 may decode the signal 163 utilizing the Viterbi algorithm to generate the signal 165. The byte deinterleaver 166 may rearrange the signal 165 on a byte-by-byte basis to generate the signal 167. The module 168 may perform Reed-Solomon decoding on the signal 167 to generate the signal 169. The signal 169 may be output for further processing (e.g., by a user interface).

In an exemplary embodiment of the invention, the receiver 150 may operate in a system requiring a spectral efficiency of at least 6 bits per second per Hertz. In such an embodiment, aspects of the present invention may enable the receiver to tolerate a cell failure rate of at least 0.0004 for any given column of the memory 152 without degrading the carrier-to-noise sensitivity threshold by more than 0.025 dB. This may be accomplished even though the memory 152 may be smaller in area than conventional memories based on foundry-standard cells. The memory 152 may be made smaller by, for example, reducing the number of, or completely eliminating, redundant columns and/or redundant rows of memory cells.

Figure 2:
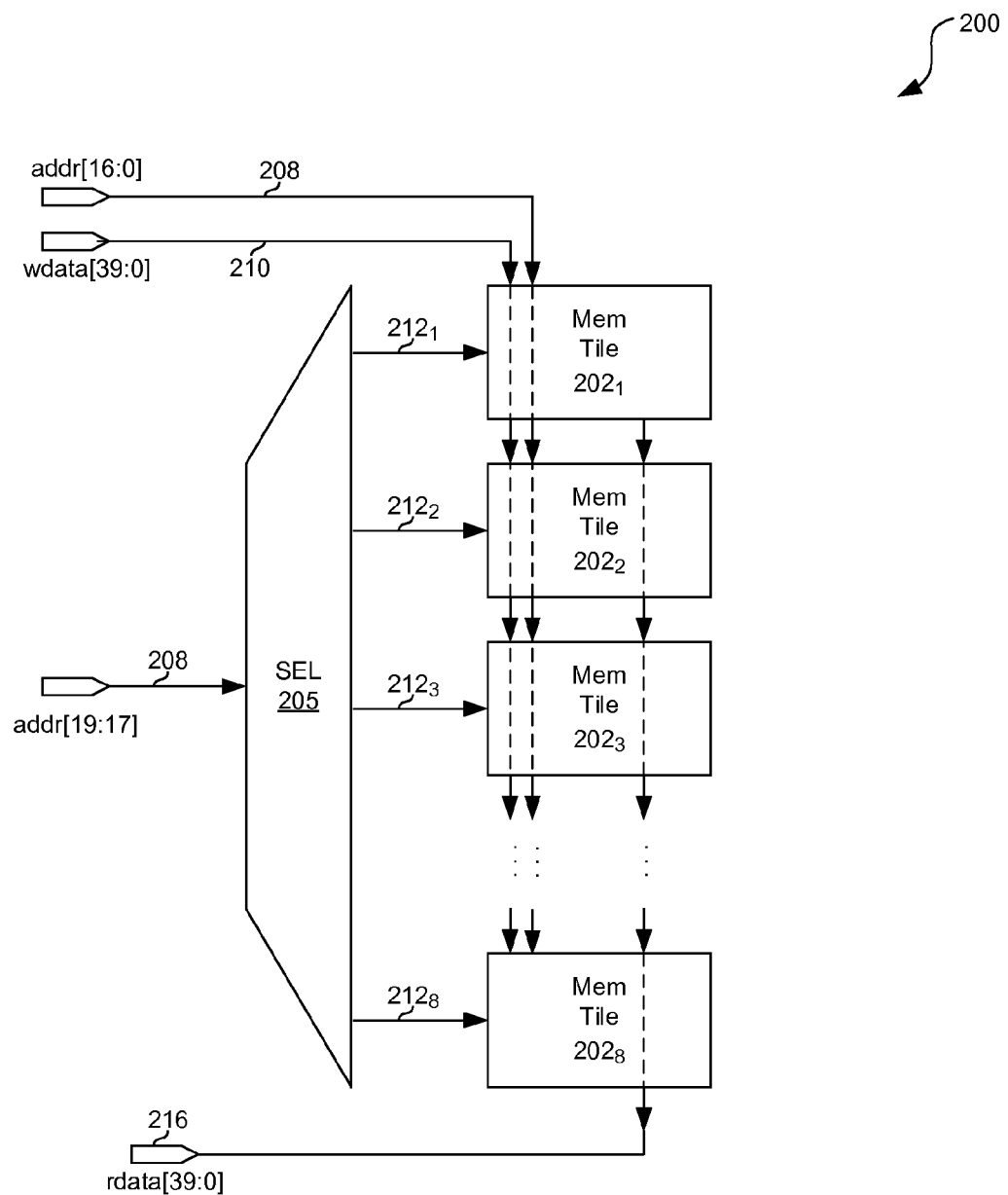
FIG. 2 depicts a first view of an exemplary fault-tolerant memory.

FIG. 2 depicts a first view of an exemplary fault-tolerant memory. Referring to FIG. 2, the memory 200 comprises a selector 205, and a plurality of memory tiles $202_1$-$202_8$. Other exemplary memories may comprise a different number of memory tiles. Also shown are an address bus 208, a write data bus 210, and a read data bus 216, and tile select lines $212_1$-$212_8$. In the exemplary memory depicted in FIG. 2, the write data bus 210 and the read data bus 216 each comprise 40 lines for carrying 40-bits of data, and the address bus 208 comprises 20 lines for carrying a 20-bit address. Although a 20-bit address and 40-bit data is depicted, the invention is not limited to any particular number of address or data bits.

The memory tiles $202_1$-$202_8$ may comprise one or more arrays of memory cells and associated peripheral components. Each array may reside entirely in one of the memory tiles $202_1$-$202_8$, or may span multiple ones of the memory tiles $202_1$-$202_8$. An exemplary memory tile $202_X$, where X is an integer between 1 and 8, inclusive, is depicted below in FIG. 3A. The selector 205 may decode the value on the three most significant lines of the address bus 208 (corresponding to the three most significant bits (MSBs) of the address) to assert one of the tile select signals $212_1$-$212_8$.

In an exemplary write operation, the address of a memory location to which data is to be written may be placed on the address bus 208, and data to be written to the memory location may be placed on the write data bus 210. The three most-significant lines of the address bus 208 may determine which one of the tile select lines $212_1$-$212_8$ is asserted. The asserted tile select line $212_X$ may result in the tile $202_X$ being selected. The seventeen least significant lines of the address bus 208 (corresponding to the seventeen least significant bits (LSBs)

of the address) may determine to which memory location in the selected tile $202_X$ the data on the write data bus 210 is written.

In an exemplary read operation, the address of a memory location from which data is to be read may be placed on the address bus 208. The three MSBs of the address may determine which one of the tile select lines $212_1$-$212_8$ is asserted. The asserted tile select line $212_X$ may result in the tile $202_X$ being selected. The seventeen least significant lines of the address bus 208 may determine which memory location in the selected tile $202_X$ is read out onto the read data bus 216.

Figure 3A:
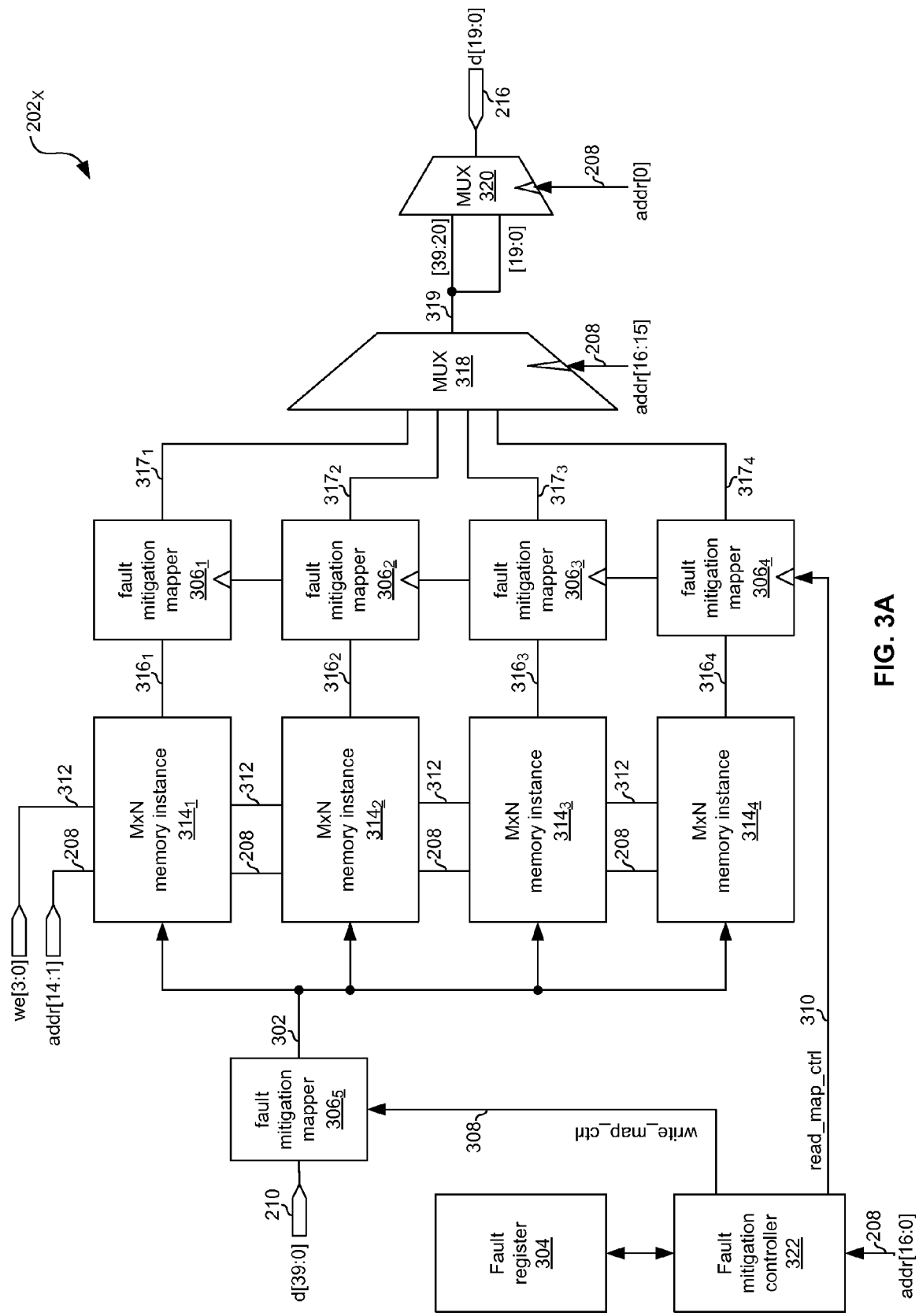
FIG. 3A depicts a second view of an exemplary fault-tolerant memory.

FIG. 3A depicts a second view of an exemplary fault-tolerant memory. Shown in FIG. 3A is an exemplary memory tile $202_X$ which may correspond to one of the memory tiles $202_1$-$202_8$ in FIG. 2. The memory tile $202_X$ comprises fault register 304, fault mitigation mapping modules $306_1$-$306_5$, fault mitigation control module 322, memory instances $314_1$-$314_4$, and multiplexer modules 318 and 320. Also shown are a write data bus 210, a read data bus 216, a bus 302, busses $316_1$-$316_4$, write map control signal 308, and a read map control signal 310.

The fault register 304 may store the results of one or more fault scans of the memory instances $314_1$-$314_4$. Such scans may occur, for example, during start-up of the system in which the memory 200 resides (e.g., receiver 150), and/or as part of testing the memory and/or system during production. During such scan(s), the memory instances $314_1$-$314_4$ may be scanned to detect faulty memory cells. For each one or more detected faulty memory cells, one or more cells of the fault register 304 may be configured. In this manner, the fault register 304 may enable determining the number and/or location of faulty memory cells in the memory instances $314_1$-$314_4$. The fault register 304 may comprise any suitable type of volatile and/or non-volatile memory such as SRAM, DRAM, ROM, EEPROM, flash, eFuse, and/or a register consisting of one or more flip-flops internal and/or external to the memory instances $314_1$-$314_4$. For example, the fault register 304 may comprise one or more one-time-programmable cells which are programmed based on a scan performed during production and one or more SRAM cells which are programmed at each start-up. In another example, results of start-up scans may be accumulated (e.g., in flash) over multiple start-ups. Memory cells of the fault register may be physically separate from the memory cells of the memory instances $314_1$-$314_4$. Alternatively (or additionally), memory cells of one or more of the memory instances $314_1$-$314_4$ may be allocated to function as the fault register.

The fault mitigation control module 322 may generate the write map control signal 308 and the read map control signal 310. During a write operation, the control module 322 may control the state of the write map control signal 308 based on the array of memory cells being written to and the contents of the fault register that corresponds to that array of memory cells. During a read operation, the control module 322 may control the state of the read map control signal 310 based on the array of memory cells being read from and the contents of the fault register that corresponds to that array of memory cells.

During a read operation, the signal lines of the bus 302 may be connected, respectively, to bit lines of each of the memory instances $314_1$-$314_4$. During a write operation, the signal lines of the bus $316_1$ may be connected to the bit lines of the memory instance $314_1$, the signal lines of the bus $316_2$ may be connected to the bit lines of the memory instance $314_2$, the signal lines of the bus $316_3$ may be connected to the bit lines of the memory instance $314_3$, and the signal lines of the bus $316_4$ may be connected to the bit lines of the memory instance $314_4$. This is illustrated in FIG. 3C, which is described below.

The fault mitigation mapper $306_5$ determines which lines of the write data bus 210 connect to which lines of the bus 302. Different values of the write map control signal 308 correspond to different mappings between the lines of the write data bus 210 and the lines of the bus 302.

The fault mitigation mapper $306_1$ determines which lines of the bus $316_1$ connect to which lines of the bus $317_1$. Ultimately, if the signal $316_1$ is selected by the multiplexer 318, the fault mitigation mapper $306_1$ determines which lines of the bus $316_1$ connect to which lines of the read data bus 216. Different values of the read map control signal 310 correspond to different mappings between the bus $316_1$ and the bus $317_1$ (and thus different mappings between the bus $316_1$ and the read data bus 216).

The fault mitigation mapper $306_2$ determines which lines of the bus $316_2$ connect to which lines of the bus $317_2$. Ultimately, if the signal $316_2$ is selected by the multiplexer 318, the fault mitigation mapper $306_2$ determines which lines of the bus $316_2$ connect to which lines of the read data bus 216. Different values of the read map control signal 310 correspond to different mappings between the bus $316_2$ and the bus $317_2$ (and thus different mappings between the bus $316_2$ and the read data bus 216).

The fault mitigation mapper $306_3$ determines which lines of the bus $316_3$ connect to which lines of the bus $317_3$. Ultimately, if the signal $316_3$ is selected by the multiplexer 318, the fault mitigation mapper $306_3$ determines which lines of the bus $316_3$ connect to which lines of the read data bus 216. Different values of the read map control signal 310 correspond to different mappings between the bus $316_3$ and the bus $317_3$ (and thus different mappings between the bus $316_3$ and the read data bus 216).

The fault mitigation mapper $306_4$ determines which lines of the bus $316_4$ connect to which lines of the bus $317_4$. Ultimately, if the signal $316_4$ is selected by the multiplexer 318, the fault mitigation mapper $306_4$ determines which lines of the bus $316_4$ connect to which lines of the read data bus 216. Different values of the read map control signal 310 correspond to different mappings between the bus $316_4$ and the bus $317_4$ (and thus different mappings between the bus $316_4$ and the read data bus 216).

The memory instances $314_1$-$314_4$ may comprise one or more arrays of memory. Each array may reside entirely in one of the memory instances $314_1$-$314_4$, or may span multiple ones of the memory instances $314_1$-$314_4$. In the exemplary embodiment of the invention, each of the memory instances $314_1$-$314_4$ may comprise M*N memory cells arranged into M rows and N columns, where each of M and N is an integer, and one or both of M and N is greater than 1.

The multiplexer 318 may select which of the busses $317_1$-$317_4$ gets routed to the bus 319. The multiplexer 318 may be controlled by one or more lines of the address bus (lines 16 and 15, corresponding to address bits 15 and 16, in the exemplary embodiment depicted in FIG. 3A).

The multiplexer 320 may select which bits of the bus 319 get routed to the read data bus 216. The multiplexer 320 may be controlled by one or more lines of the address bus (line 0, corresponding to address bit 0, in the exemplary embodiment depicted in FIG. 3A).

In operation, at start-up and/or during fabrication/production testing, a scan of the memory instances $314_1$-$314_4$ may be performed and the location of faulty memory cells may be stored in the fault register 304. After the scan is complete, the memory $202_X$ may begin normal operation in which data is read from and written to the memory $202_X$, where X is an integer between 1 and 8, inclusive.

For a write operation, data to be written to a memory location may be placed on the lines of the bus 210 and the address of the location to be written to ("ADRS_W") may be placed on the address bus 208. The fault mitigation control module 322 may look up ADRS_W in the fault register 304 to determine if there are any faulty memory cells at that location in the memory instances $314_1$-$314_4$. The fault mitigation control module 322 may set the write map control signal 308 to configure the mapper $306_5$ to implement a mapping that corresponds to the results of the look-up. The data on the bus 210 may then be mapped onto the bus 302. The bit of the write enable signal 312 corresponding to memory instance $314_W$ (the memory instance corresponding to ADRS_W) may then be asserted, causing the lines of the bus 302 to be connected to bit lines of the memory instance $314_W$, and effecting the write operation.

For a read operation, the address to be read from ("ADRS_R") may be placed on the address bus 208. The fault mitigation control module 322 may look up ADRS_R in the fault register 304 to determine if there are any faulty memory cells at that location in the memory instances $314_1$-$314_4$. The fault mitigation control module 322 may set the read map control signal 310 to configure the mappers $306_1$-$306_4$ to implement a mapping that corresponds to the results of the look-up. The memory cells corresponding ADRS_R in each of the memory instances $314_1$-$314_4$ may be read out onto busses $316_1$-$316_4$, respectively. The lines of the bus $316_1$ may be mapped to the lines of the bus $317_1$ by the mapper $306_1$, the lines of the bus $316_2$ may be mapped to the lines of the bus $317_2$ by the mapper $306_2$, the lines of the bus $316_3$ may be mapped to the lines of the bus $317_3$ by the mapper $306_3$ the lines of the bus $316_4$ may be mapped to the lines of the bus $317_4$ by the mapper $306_4$. Based on bits 16 and 15 of ADRS_R, the multiplexer 318 connects one of the busses $317_1$-$317_4$ to the bus 319. Based on bit 0 of ADRS_R, either a first portion or a second portion of the lines of the bus 319 are connected to the lines of the read data bus 216.

Figure 3B:
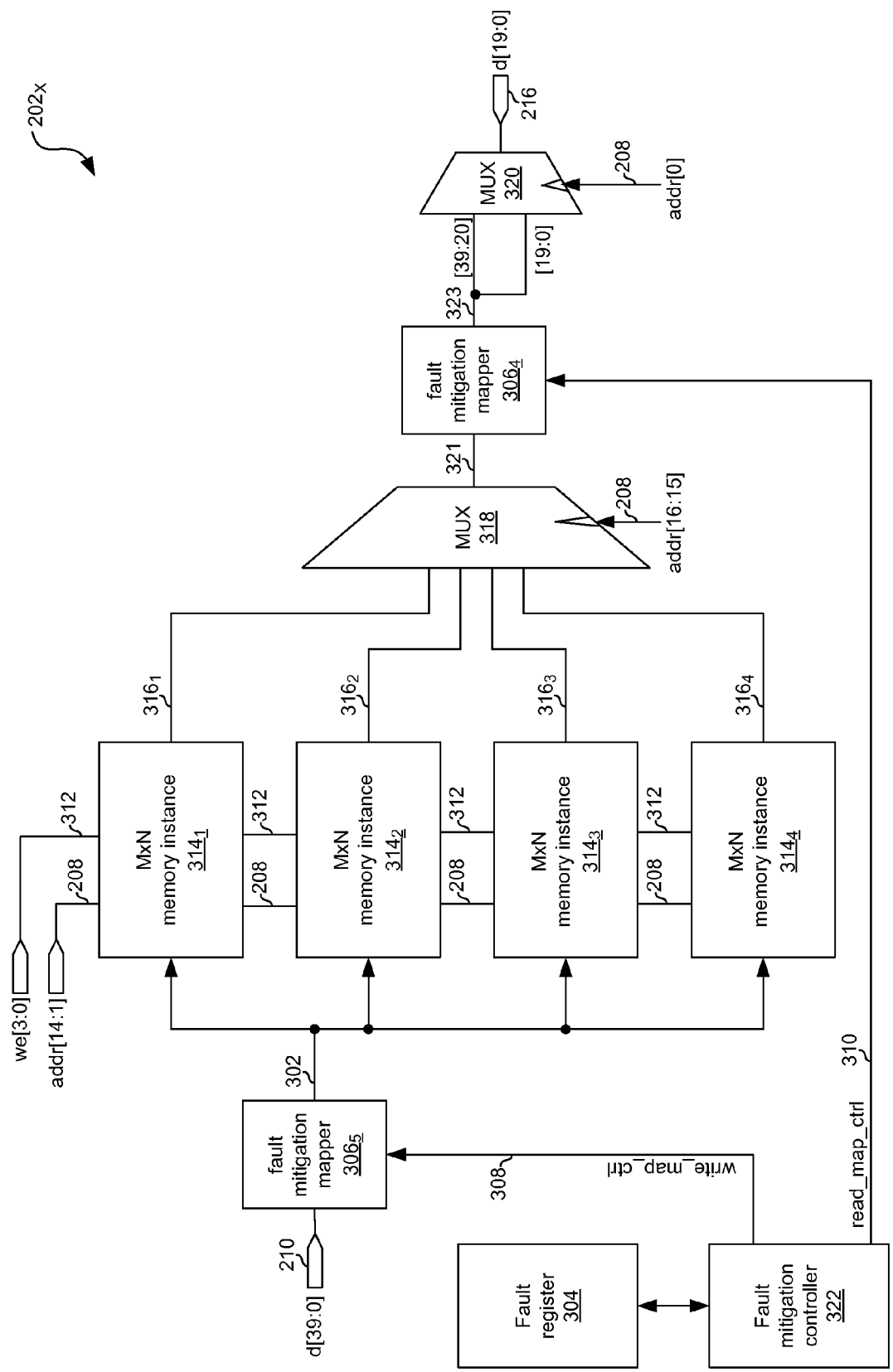
FIG. 3B depicts a second view of another exemplary fault-tolerant memory.
Figure 3C:
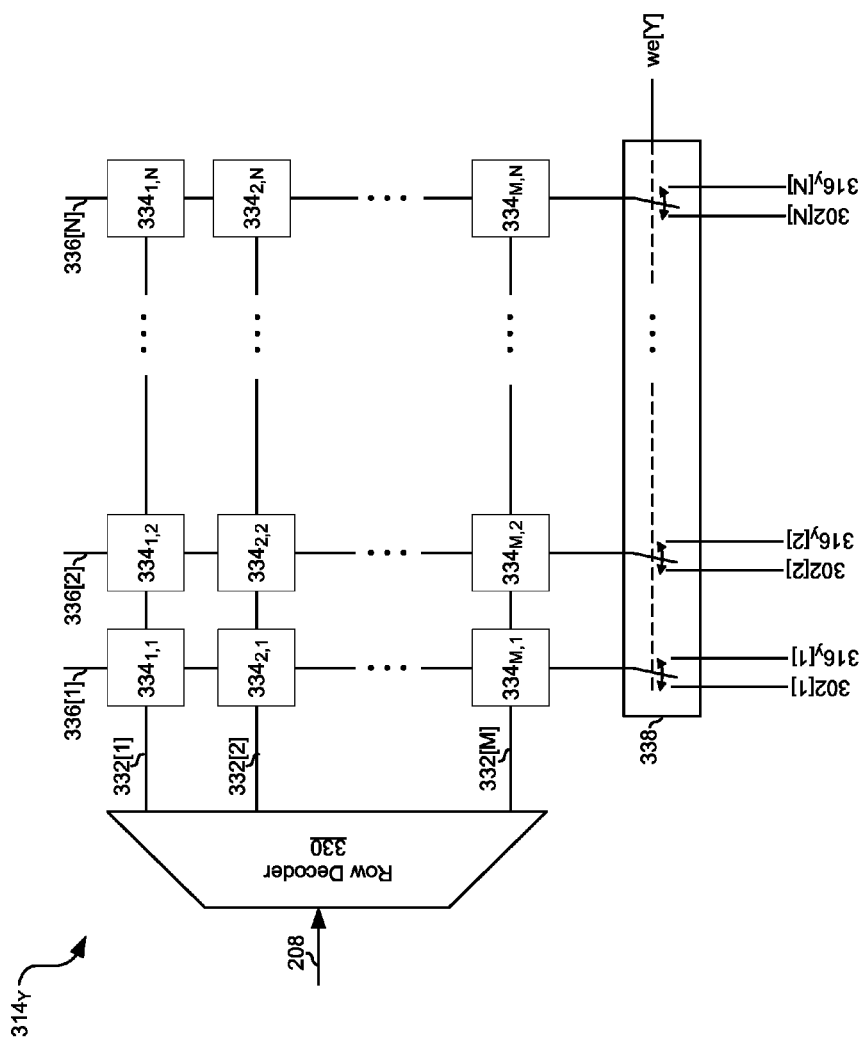
FIG. 3C depicts an exemplary memory instance.

FIG. 3B depicts a second view of another exemplary fault-tolerant memory. The memory of FIG. 3B may be similar to the memory of FIG. 3A but may differ in that the outputs of the memory instances $314_1$-$314_4$ are multiplexed onto the bus 321 prior to being mapped onto the bus 323 by the mapper $306_6$ (which could correspond to any one of mappers $306_1$-$306_4$ of FIG. 3A, for example). Whether the memory in FIG. 3A or the memory in FIG. 3B (or another memory not shown) is utilized along with aspects of the present invention may depend on various design constraints and considerations.

FIG. 3C depicts an exemplary memory instance. Shown in FIG. 3C is an exemplary memory instance $314_Y$ which may correspond to any one of the memory instances $314_1$-$314_4$ shown in FIG. 3A. The memory instance $314_Y$ comprises a row decoder 330, word/row lines 332[1:M], bit lines 336[1:N], memory cells $334_{1,1}$-$334_{M,N}$, and column input/output module 338. The cells $334_{1,1}$-$334_{M,N}$ may reside in one or more of the memory instances $314_1$-$314_4$ of one or more of the memory tiles $202_1$-$202_8$. Although a single-ended embodiment is depicted, each word line 332[m] and/or each bit line 336[n] could comprise two lines for differential signaling. As utilized herein the term "bit line" is utilized for referring to both a single-ended bit line and a differential pair bit line.

The row decoder 330 may decode a portion of the binary encoded address on the bus 208 such that the row line corresponding to the address 208 is asserted (i.e. "selected") while the remaining word lines 332 are deasserted (i.e. "unselected").

Each of the memory cells $334_{1,1}$-$334_{M,N}$ may be operable to store a bit of data. Each memory cell may comprise, for example, cross-coupled inverters and one or more access transistors.

The column input/output module 338 may select whether the bus 302 (see FIG. 3A) or a bus 316 (see FIG. 3A) is connected to the bit lines 336[1:N]. When we[Y], the bit of the write enable signal 312 corresponding to the memory instance $314_Y$, is asserted, the bus 316 corresponding to the memory instance $314_Y$ may be coupled to the bit lines 336[1:N], when we[y] is deasserted the bus 302 may be connected to the bit lines 336[1:N].

FIG. 3D illustrates an exemplary mapping between a fault register and memory cells managed via the fault register. Referring to FIG. 3D, there is shown an M row by N column block of memory 351, wherein M and N are integers, and one or both of them is greater than 1. In an exemplary embodiment of the invention, each row of memory 351 may correspond to a particular memory address (and thus each row may be an "array" as that term is utilized herein). In another embodiment, each row may comprise a plurality of arrays corresponding to a plurality of memory addresses. In still another embodiment, arrays in the memory block 351 may span multiple rows and, thus, a single memory address may correspond to multiple rows. Also shown are memory cells $350_1$-$350_K$, where K=ceiling(M/i), "ceiling( )" denotes a rounding up to the nearest integer, and i is an integer between 1 and M, inclusive. Each first portion 352 of the memory block 351 may correspond to i rows of memory cells of the memory block 351 and may be associated with one of the fault register memory cells $350_1$-$350_K$. Accordingly, larger values of i may correspond to smaller fault registers, while smaller values of i may provide better mitigation of faulty cells in the memory block 351. The value of i may, for example, be fixed for the life of the memory. The value of i may be determined, for example, based on the feature size and/or other characteristics of the technology process by which the memory block 351 is fabricated. Additionally or alternatively, the value of may be determined each time the memory block 351 starts-up (e.g., based on a built-in self-test). The exemplary embodiment in FIG. 3D wherein one fault register cell $350_k$ corresponds to each i rows of the block of memory 351, may correspond to an embodiment in which arrays are zoned into two sensitivity zones (sensitivity zones are described in further detail below). The invention, however, is not so limited, and more than one fault register bit may correspond to each i rows of the block of memory 351. In an exemplary embodiment of the invention, the number of fault register cells that correspond to each i rows may be equal to ceiling($\log_2$ R), where R is and integer greater than 1 that represents the number of sensitivity zones. For example, for R=4 (e.g., High, Med. High, Med. Low, and Low) sensitivity zones, there may be two fault register cells for each i rows of memory.

Figure 3E:
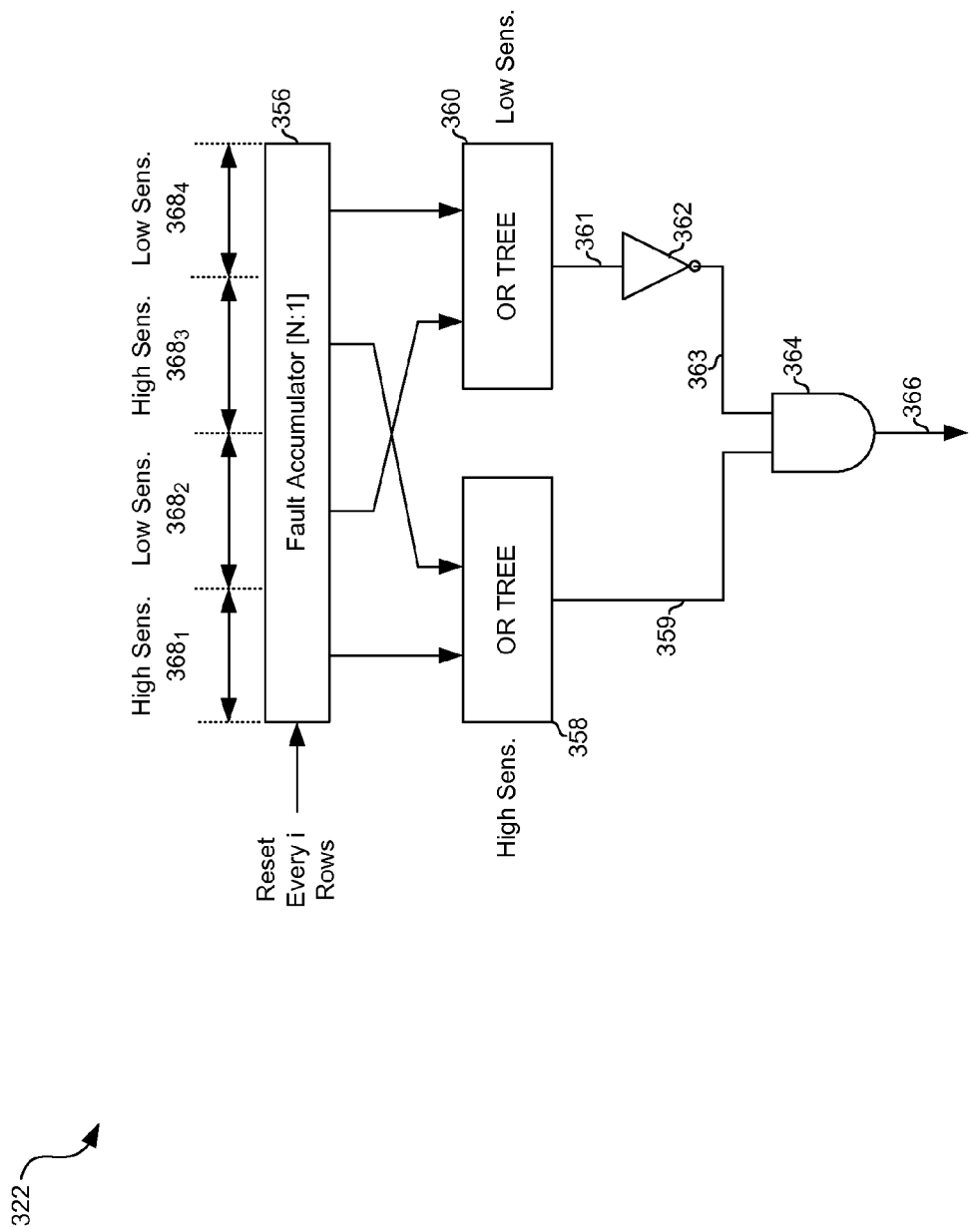
FIG. 3E illustrates an exemplary portion of a fault mitigation controller.

FIG. 3E illustrates an exemplary portion of a fault mitigation controller. Referring to FIG. 3E, the depicted portion of the fault mitigation controller 322 comprises a fault accumulator 356, and logic modules 358, 360, 362, and 364.

In operation, upon start-up of the memory 200, a scan of the memory 200 may be initiated. The scan may comprise writing test data to memory, reading the test data from memory, and then comparing the written data to the read data to detect faulty memory cells. Each cell or group of cells of the fault accumulator 356 may correspond to a particular column of memory in the block of memory being scanned. Accordingly, for the i rows being tested, each time a faulty cell is detected in a particular column, the one or more bits of the fault accumulator 356 corresponding to that column are incremented.

To illustrate, consider the portion of cells $352_1$ (FIG. 3D) corresponding to the first i rows of a block of memory 351. Test data may be written to and then read from the cells in portion $352_1$ to detect any faulty cells in portion $352_1$. For each column 1 through N, the one or more bits of the fault accumulator 356 corresponding to that column may be incremented each time a faulty memory cell is detected in that column of the portion $352_1$. Once all cells in the portion $352_1$ have been tested, one or more logical and/or arithmetic operations are applied to the contents of fault accumulator 356 to determine whether the cell $350_1$ of the fault register should be asserted or deasserted. Cell $350_1$ being asserted may indicate that a first mapping is to be utilized when writing to and reading from an array in the portion $352_1$. Conversely, cell $350_1$ being deasserted may indicate that a second mapping is to be utilized when writing to and reading from an array in the portion $352_1$.

The logical and/or arithmetic operations performed on the contents of the fault register 356 may depend on which columns of the portion $352_1$ correspond to high-sensitivity zones and which columns of the portion $352_1$ correspond to low-sensitivity zones. In the exemplary portion depicted, there are high-sensitivity portions $368_1$ and $368_3$ and low-sensitivity portions $368_2$ and $368_4$, each of the portions each comprising one or more bits corresponding to one or more columns of the memory block 351. The bit(s) of the portions $368_1$ and $368_3$ are logically ORed by module 358, to generate signal 359. The bit(s) of the portions $368_2$ and $368_4$ are logically ORed by module 360, to generate signal 361. The signal 361 is inverted by inverter 362, to generate signal 363. Signals 361 and 363 are ANDed to generate signal 366. If signal 366 is asserted, then a 1 may be written to memory cell $350_1$ and if signal 366 is deasserted, then a 0 may be written to memory cell $350_1$.

Each of portions $352_2$-$352_K$, may be scanned for faults in a manner similar to that described above for portion $352_1$. Each of the fault register cells $350_2$-$350_K$ may be populated in a manner similar to that described above for cell $350_1$.

FIGS. 4A-4E depict an exemplary system in which an array of memory is zoned into two sensitivity zones for mitigating the impact of one or more faulty cells in the array. Shown in FIGS. 4A-4E are an array of memory cells 400, a fault register 402 associated with the array 400, and an 8-bit data block to be written to the array 400. In the exemplary embodiment depicted in FIGS. 4A-4E the array 400 is 8 bits and the data block is 8 bits, but the invention is not so limited.

Based on the data to be stored to the array 400, the cells of the array 400 may be zoned into a high sensitivity zone and a low sensitivity zone. To illustrate, in the exemplary embodiment depicted in FIGS. 4A-4C, the data block 404 is an 8-bit number with bit [7] being the MSB and bit [0] being the LSB. In this embodiment, an error in one of bits [7:4] of the data block 404 would cause a larger deviation in system performance from the correct value than would an error in one of bits [3:0] of the data block 404. For example, in a digital communication or video system, bit error rate (BER), packet error rate (PER), or frame error rate (FER) may be lower with an error in bits [7:4] than with an error in bits [3:0]. Accordingly, the upper four cells (cells [7:4]) have been zoned as higher sensitivity cells, and the lower four cells (cells [3:0]) have been zoned as lower sensitivity cells. In an embodiment of the invention, which sensitivity zone a cells and/or column should be assigned to may be determined based on a normalized difference in a system performance metric (e.g., bit error rate (BER)) due to that cell and/or column being faulty as compared to that cell and/or column being functional.

In operation, the mapping between the cells [7:0] of the array 400 and the bits [7:0] of the data block 404 may be determined based on a mapping indicated by the fault register 402.

Figure 4A:
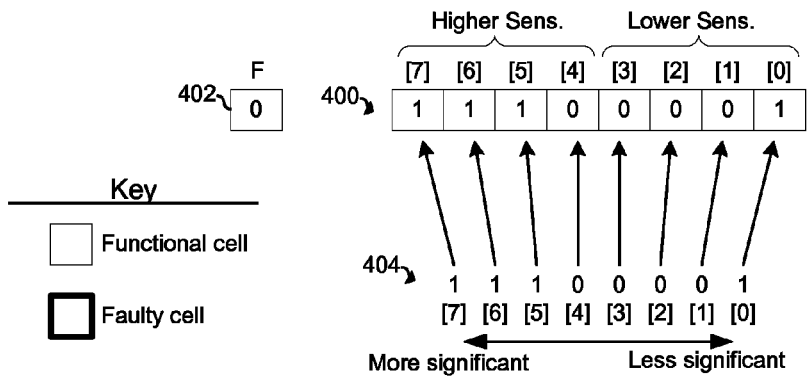
FIGS. 4A-4E depict an exemplary system in which an array of memory is zoned into two zones for mitigating the impact of one or more faulty cells in the array.

In FIG. 4A, there are no faulty cells in the array 400. Accordingly, the fault register 402 indicates that a first mapping is to be utilized. In the exemplary embodiment depicted in FIGS. 4A-4E, the first mapping results in the bits [0:N] of the data block 404 being written sequentially to the cells [0:N] of the array 400. That is, the mapping utilized in FIG. 4A is as shown in table 1 below.

TABLE 1

| Cell of array 400 | Bit of data block 404 |
|---|---|
| [0] | [0] |
| [1] | [1] |
| [2] | [2] |
| [3] | [3] |
| [4] | [4] |
| [5] | [5] |
| [6] | [6] |
| [7] | [7] |

Figure 4B:
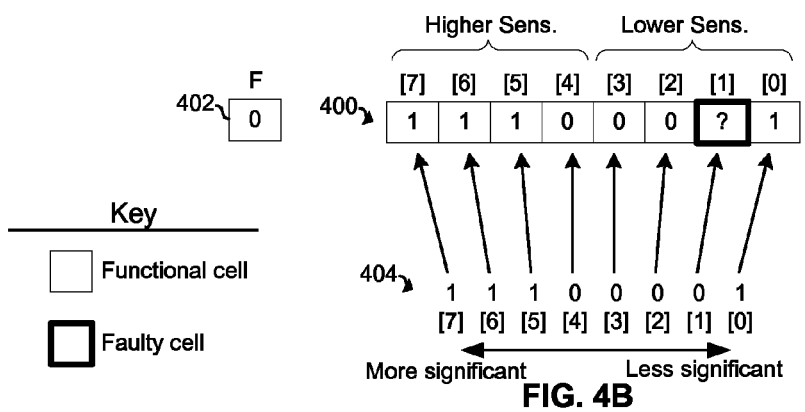

In FIG. 4B, there is a faulty memory cell (cell [1]) in the lower sensitivity zone, but none in the higher sensitivity zone. Accordingly, the fault register 402 indicates that the first mapping is to be used.

Figure 4C:
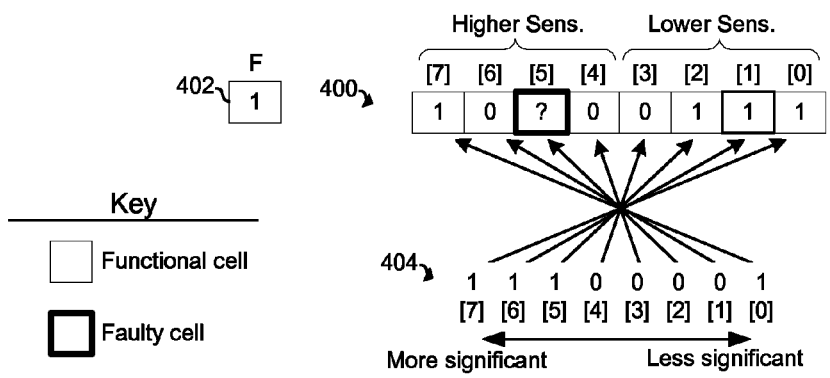

In FIG. 4C, there is a faulty memory cell (cell [5]) in the higher sensitivity zone and none in the lower sensitivity zone. Accordingly, the fault register 402 indicates that a second mapping is to be used. In the exemplary embodiment depicted in FIGS. 4A-4E, the second mapping results in the bits [0:N] of the data block 404 being written reverse-sequentially to the cells [0:N] of the array 400. That is, the mapping utilized in FIG. 4C is as shown in table 2 below.

TABLE 2

| Cell of array 400 | Bit of data block 404 |
|---|---|
| [0] | [7] |
| [1] | [6] |
| [2] | [5] |
| [3] | [4] |
| [4] | [3] |
| [5] | [2] |
| [6] | [1] |
| [7] | [0] |

Figure 4D:
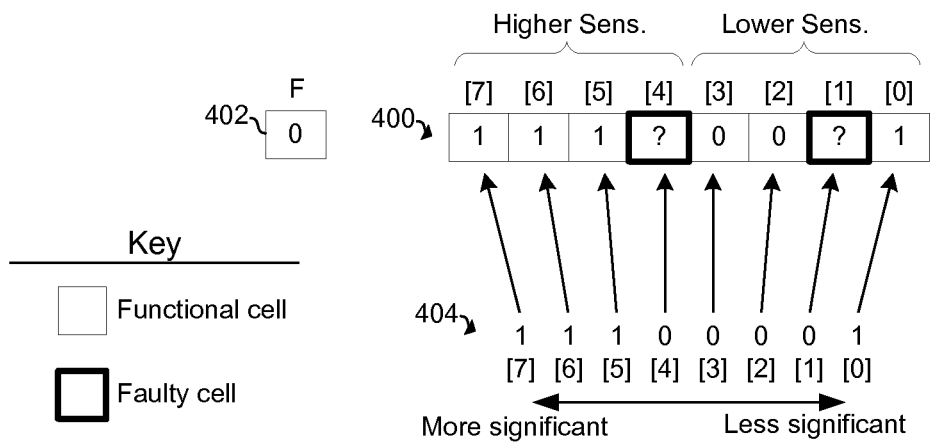
Figure 4E:
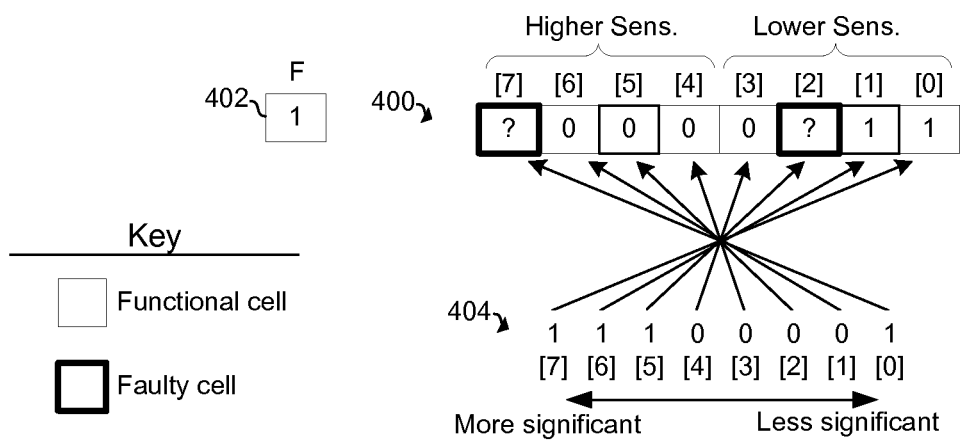

In FIG. 4D, there is a faulty memory cell (cell [4]) in the higher sensitivity zone and a faulty memory cell (cell [1]) in the lower sensitivity zone. Aspects of the invention may enable comparing the potential error in the value of the data block 404 for each available mapping to determine which mapping to utilize. To illustrate, in FIG. 4D, the first mapping results in a potential errors at bits 4 and 1, and the second mapping results in potential errors at bits 6 and 3. Accordingly, in FIG. 4D, the first mapping may be utilized. Similarly, in FIG. 4E, the first mapping results in potential errors at bits 7 and 2, and the second mapping results in potential errors at bits 5 and 0. Accordingly, in FIG. 4E, the second mapping is utilized.

FIGS. 5A-5K depict an exemplary system in which an array of memory is zoned into four zones for mitigating the impact of one or more faulty cells in the array. Shown in FIGS. 5A-5K are an array of memory cells 500, a fault register 502 associated with the array 500, and an 8-bit data block to be written to the array 500. In the exemplary embodiment depicted in FIGS. 5A-5K the array 500 is 8 bits and the data block is 8 bits, but the invention is not so limited.

Based on the data to be stored to the array 500, the cells of the array 500 may be zoned into four zones by relative error sensitivity. To illustrate, in the exemplary embodiment depicted in FIGS. 5A-5I, the data block 504 is an 8-bit number with bit [7] being the MSB and bit [0] being the LSB. In this embodiment, cells [7:6] are zoned as relatively high sensitivity, cells [5:4] are zoned as relatively medium-high sensitivity, cells [3:2] are zoned as relatively medium-low sensitivity, cells [1:0] are zoned as relatively low sensitivity.

In operation, the mapping between the cells [7:0] of the array 500 and the bits [7:0] of the data block 504 may be determined based on a mapping indicated by the 2-bit fault register 502.

Figure 5A:
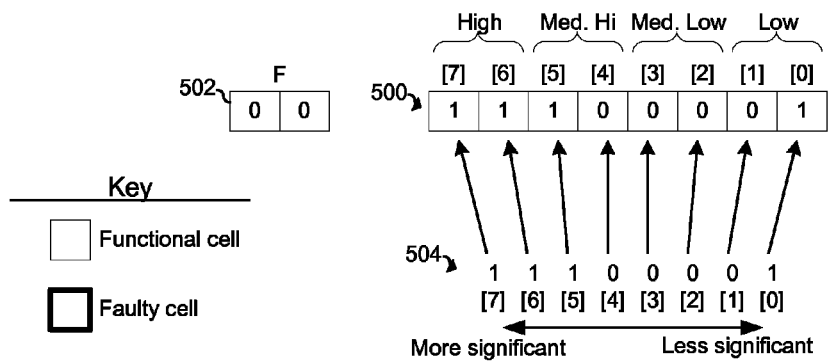
FIGS. 5A-5K depict an exemplary system in which an array of memory is zoned into four zones for mitigating the impact of one or more faulty cells in the array.

In FIG. 5A, there are no faulty cells in the array 500. Accordingly, the fault register 502 indicates that a first mapping is to be utilized. In the exemplary embodiment depicted in FIGS. 5A-5K, the first mapping results in the bits [0:N] of the data block 504 being written sequentially to the cells [0:N] of the array 500. That is, the mapping utilized in FIG. 5A is as shown in table 3 below.

TABLE 3

| Cell of array 500 | Bit of data block 504 |
|---|---|
| [0] | [0] |
| [1] | [1] |
| [2] | [2] |
| [3] | [3] |
| [4] | [4] |
| [5] | [5] |
| [6] | [6] |
| [7] | [7] |

Figure 5B:
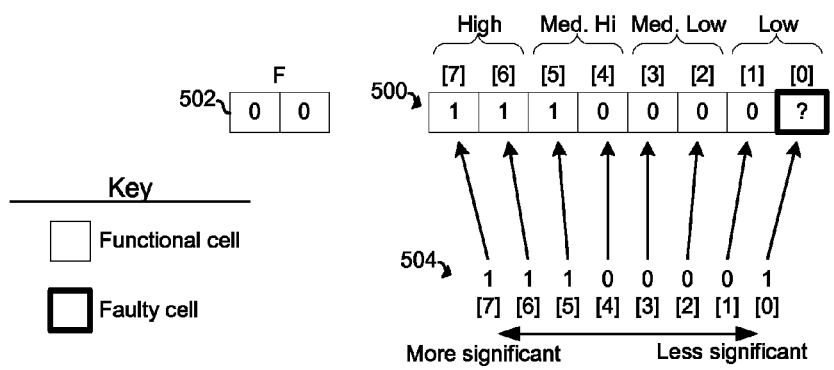

In FIG. 5B, there is a faulty memory cell (cell [0]) in the relatively low sensitivity zone. Accordingly, the fault register 502 indicates that the first mapping is to be used.

Figure 5C:
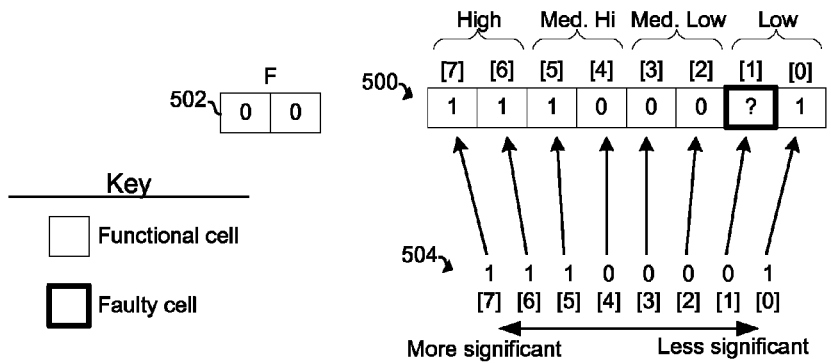

In FIG. 5C, there is a faulty memory cell (cell [1]) in the relatively low sensitivity zone. Accordingly, the fault register 502 indicates that the first mapping is to be used.

Figure 5D:
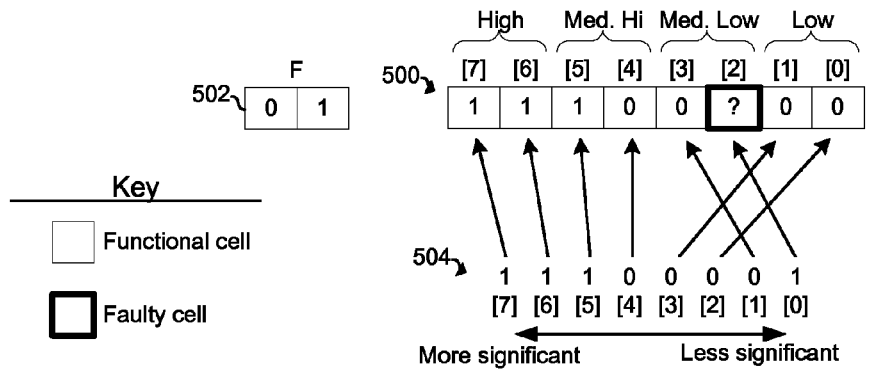

In FIG. 5D, there is a faulty memory cell (cell [2]) in the medium-low sensitivity zone. Accordingly, the fault register 502 indicates that a second mapping is to be used. In the exemplary embodiment depicted in FIGS. 5A-5I, the second mapping results in the cells [3:2] of the array 500 being swapped with the cells [1:0] of the array 500. That is, the mapping utilized in FIG. 5D is as shown in table 4 below.

TABLE 4

| Cell of array 500 | Bit of data block 504 |
|---|---|
| [2] | [0] |
| [3] | [1] |
| [0] | [2] |
| [1] | [3] |
| [4] | [4] |
| [5] | [5] |
| [6] | [6] |
| [7] | [7] |

Figure 5E:
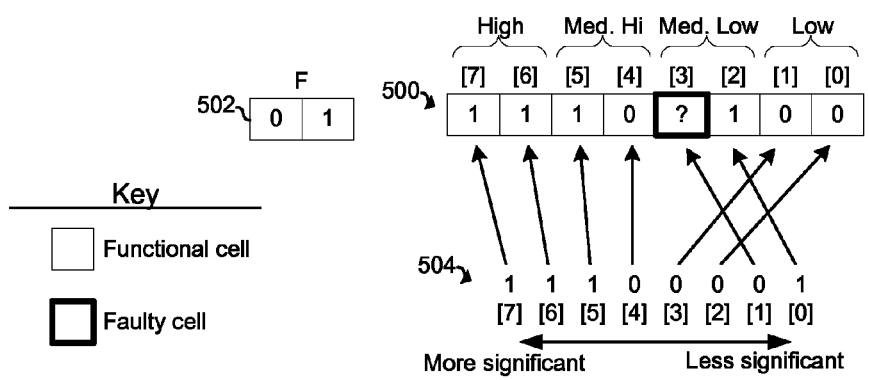

In FIG. 5E, there is a faulty memory cell (cell [3]) in the medium-low sensitivity zone. Accordingly, the fault register 502 indicates that the second mapping is to be used.

Figure 5F:
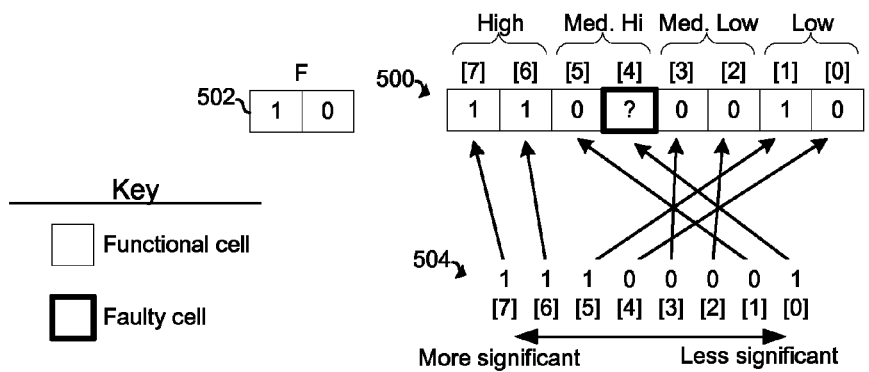

In FIG. 5F, there is a faulty memory cell (cell [4]) in the medium-high sensitivity zone. Accordingly, the fault register 502 indicates that a third mapping is to be used. In the exemplary embodiment depicted in FIGS. 5A-5I, the third mapping results in the cells [5:4] of the array 500 being swapped with the cells [1:0] of the array 500. That is, the mapping utilized in FIG. 5F is as shown in table 5 below.

TABLE 5

| Cell of array 500 | Bit of data block 504 |
|---|---|
| [4] | [0] |
| [5] | [1] |
| [2] | [2] |
| [3] | [3] |
| [0] | [4] |
| [1] | [5] |
| [6] | [6] |
| [7] | [7] |

Figure 5G:
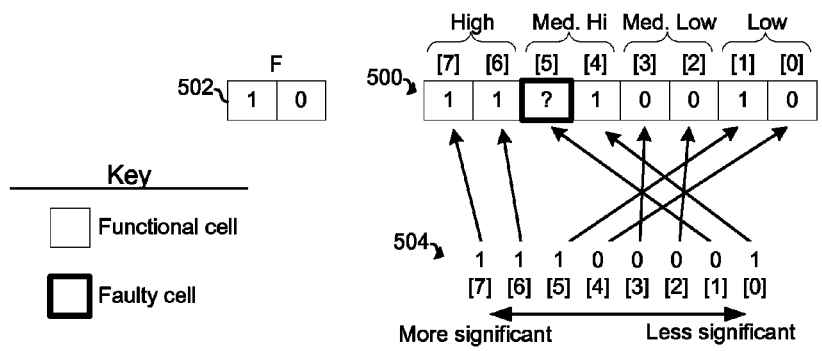

In FIG. 5G, there is a faulty memory cell (cell [5]) in the medium-high sensitivity zone. Accordingly, the fault register 502 indicates that the third mapping is to be used.

Figure 5H:
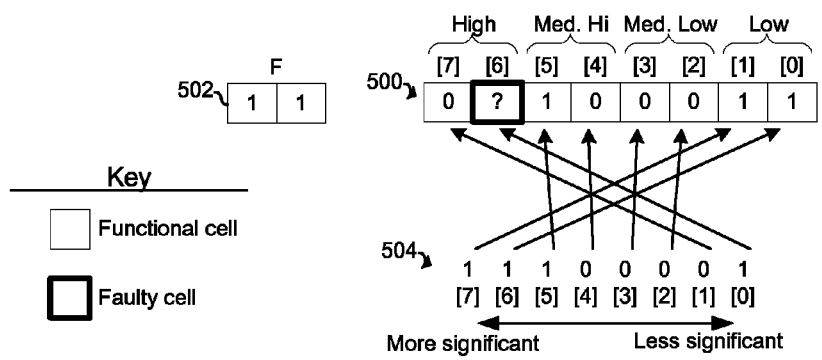

In FIG. 5H, there is a faulty memory cell (cell [6]) in the relatively high sensitivity zone. Accordingly, the fault register 502 indicates that a fourth mapping is to be used. In the exemplary embodiment depicted in FIGS. 5A-5I, the fourth mapping results in the cells [7:6] of the array 500 being swapped with the cells [1:0] of the array 500. That is, the mapping utilized in FIG. 5H is as shown in table 6 below.

TABLE 6

| Cell of array 500 | Bit of data block 504 |
|---|---|
| [7] | [0] |
| [6] | [1] |
| [2] | [2] |
| [3] | [3] |
| [4] | [4] |
| [5] | [5] |
| [0] | [6] |
| [1] | [7] |

Figure 5I:
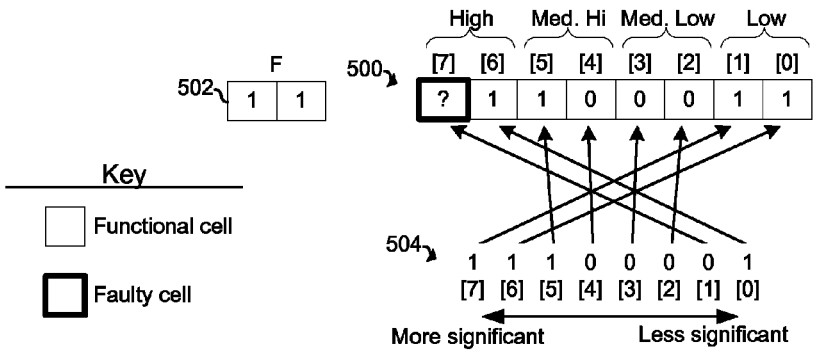

In FIG. 5I, there is a faulty memory cell (cell [7]) in the relatively high sensitivity zone. Accordingly, the fault register 502 indicates that the fourth mapping is to be used.

Figure 5J:
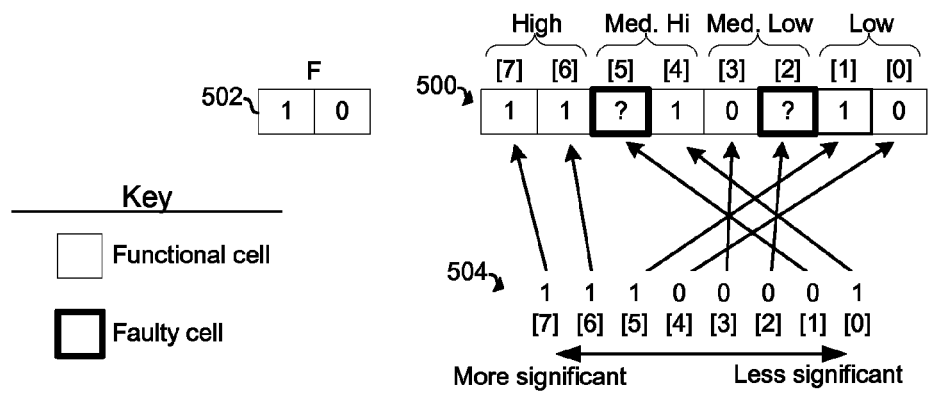

In FIG. 5J, there is a faulty memory cell (cell [5]) in the medium-high sensitivity zone, and a faulty memory cell (cell [2]) in the medium-low sensitivity zone. The second mapping would result in potential errors at bits 5 and 0. The third mapping would result in potential errors at bits 2 and 1. Accordingly, the fault register 502 indicates that the third mapping is to be used.

Figure 5K:
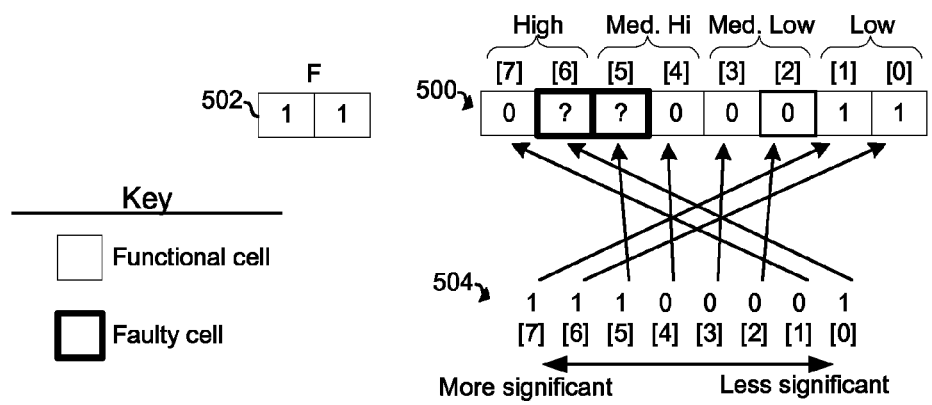

In FIG. 5K, there is a faulty memory cell (cell [6]) in the relatively high sensitivity zone, and a faulty memory cell (cell [5]) in the medium-high sensitivity zone. The third mapping would result in potential errors at bits 6 and 1. The fourth mapping would result in potential errors at bits 5 and 0. Accordingly, the fault register 502 indicates that the fourth mapping is to be used.

While FIGS. 4A-4D depict two sensitivity zones, and FIGS. 5A-5K depict four sensitivity zones, in practice, the number of sensitivity zones utilized can be any integer greater than 1.

Figure 6A:
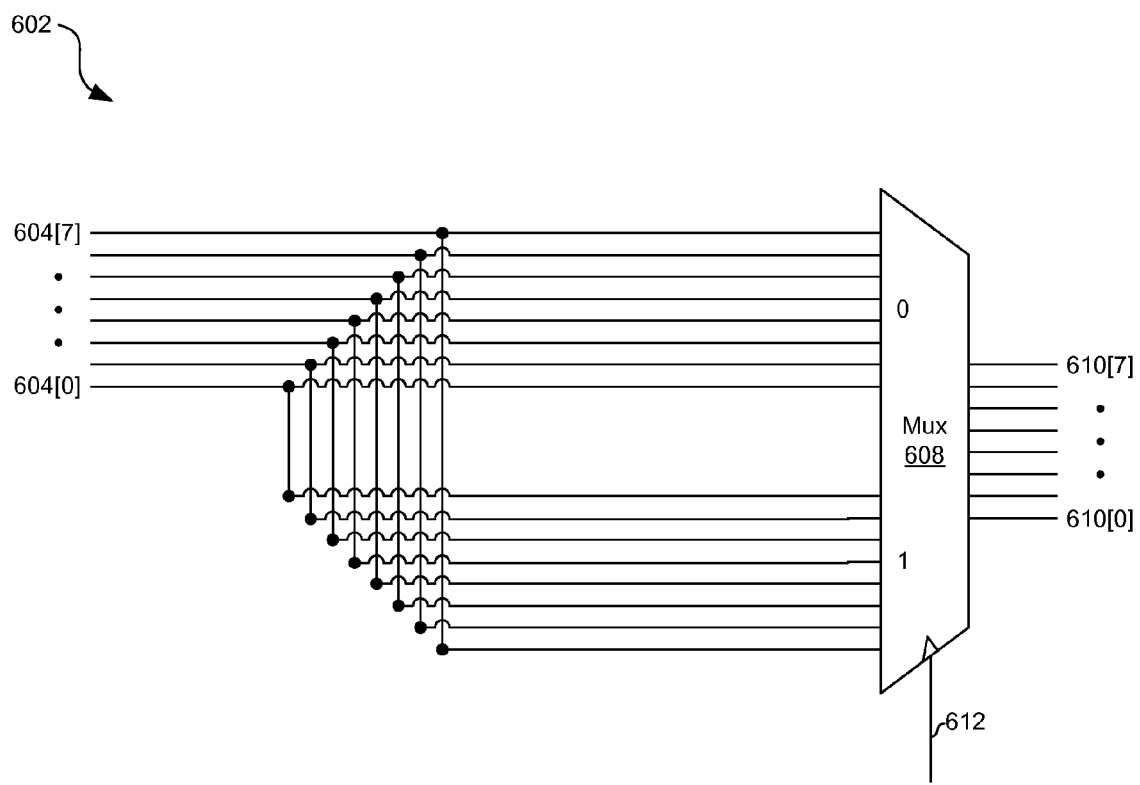
FIG. 6A depicts an exemplary fault mitigation mapping module.

FIG. 6A depicts an exemplary fault mitigation mapping module. Referring to FIG. 6A, the fault mitigation mapping module 602 comprises input lines 604[7:0], output lines 610 [7:0], a multiplexer 608, and a control signal 612. When the control signal 612 is logic 0, the lines 604[7:0] may be mapped to the lines 610[7:0] as shown below in table 7. When the control signal 612 is logic 1, the lines 604[7:0] may be mapped to the lines 610[7:0] is as shown below in table 8.

TABLE 7

| 604[0] | 610[0] |
|---|---|
| 604[1] | 610[1] |
| 604[2] | 610[2] |
| 604[3] | 610[3] |
| 604[4] | 610[4] |
| 604[5] | 610[5] |
| 604[6] | 610[6] |
| 604[7] | 610[7] |

TABLE 8

| 604[0] | 610[7] |
|---|---|
| 604[1] | 610[6] |
| 604[2] | 610[5] |
| 604[3] | 610[4] |
| 604[4] | 610[3] |
| 604[5] | 610[2] |
| 604[6] | 610[1] |
| 604[7] | 610[0] |

Figure 6B:
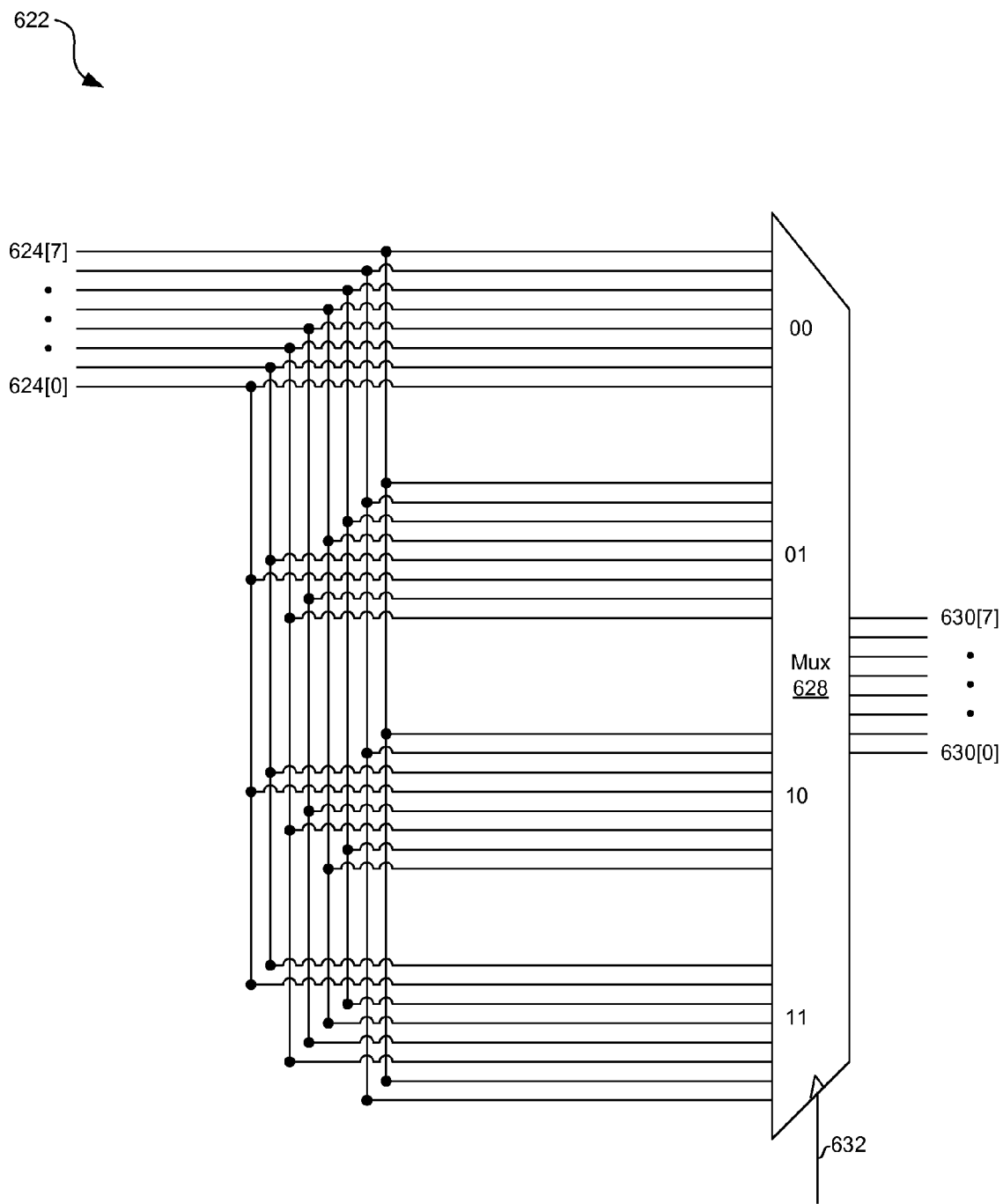
FIG. 6B depicts another exemplary fault mitigation mapping module.

FIG. 6B depicts another exemplary fault mitigation mapping module. Referring to FIG. 6B, the fault mitigation mapping module 622 comprises input lines 624[7:0], output lines 630[7:0], a multiplexer 628, and a control signal 632. When the control signal 632 is logic 00, the lines 624[7:0] may be mapped to the lines 630[7:0] as shown below in table 9. When the control signal 632 is logic 01, the lines 624[7:0] may be mapped to the lines 630[7:0] is as shown below in table 10. When the control signal 632 is logic 10, the lines 624[7:0] may be mapped to the lines 630[7:0] is as shown below in table 11. When the control signal 632 is logic 11, the lines 624[7:0] may be mapped to the lines 630[7:0] is as shown below in table 12.

TABLE 9

| 624[0] | 630[0] |
|---|---|
| 624[1] | 630[1] |
| 624[2] | 630[2] |
| 624[3] | 630[3] |
| 624[4] | 630[4] |
| 624[5] | 630[5] |
| 624[6] | 630[6] |
| 624[7] | 630[7] |

TABLE 10

| 624[2] | 630[0] |
|---|---|
| 624[3] | 630[1] |
| 624[0] | 630[2] |
| 624[1] | 630[3] |
| 624[4] | 630[4] |
| 624[5] | 630[5] |
| 624[6] | 630[6] |
| 624[7] | 630[7] |

TABLE 11

| 624[4] | 630[0] |
|---|---|
| 624[5] | 630[1] |
| 624[2] | 630[2] |
| 624[3] | 630[3] |
| 624[0] | 630[4] |
| 624[1] | 630[5] |
| 624[6] | 630[6] |
| 624[7] | 630[7] |

TABLE 12

| 624[6] | 630[0] |
|---|---|
| 624[7] | 630[1] |
| 624[2] | 630[2] |
| 624[3] | 630[3] |
| 624[4] | 630[4] |
| 624[5] | 630[5] |
| 624[0] | 630[6] |
| 624[1] | 630[7] |

Figure 6C:
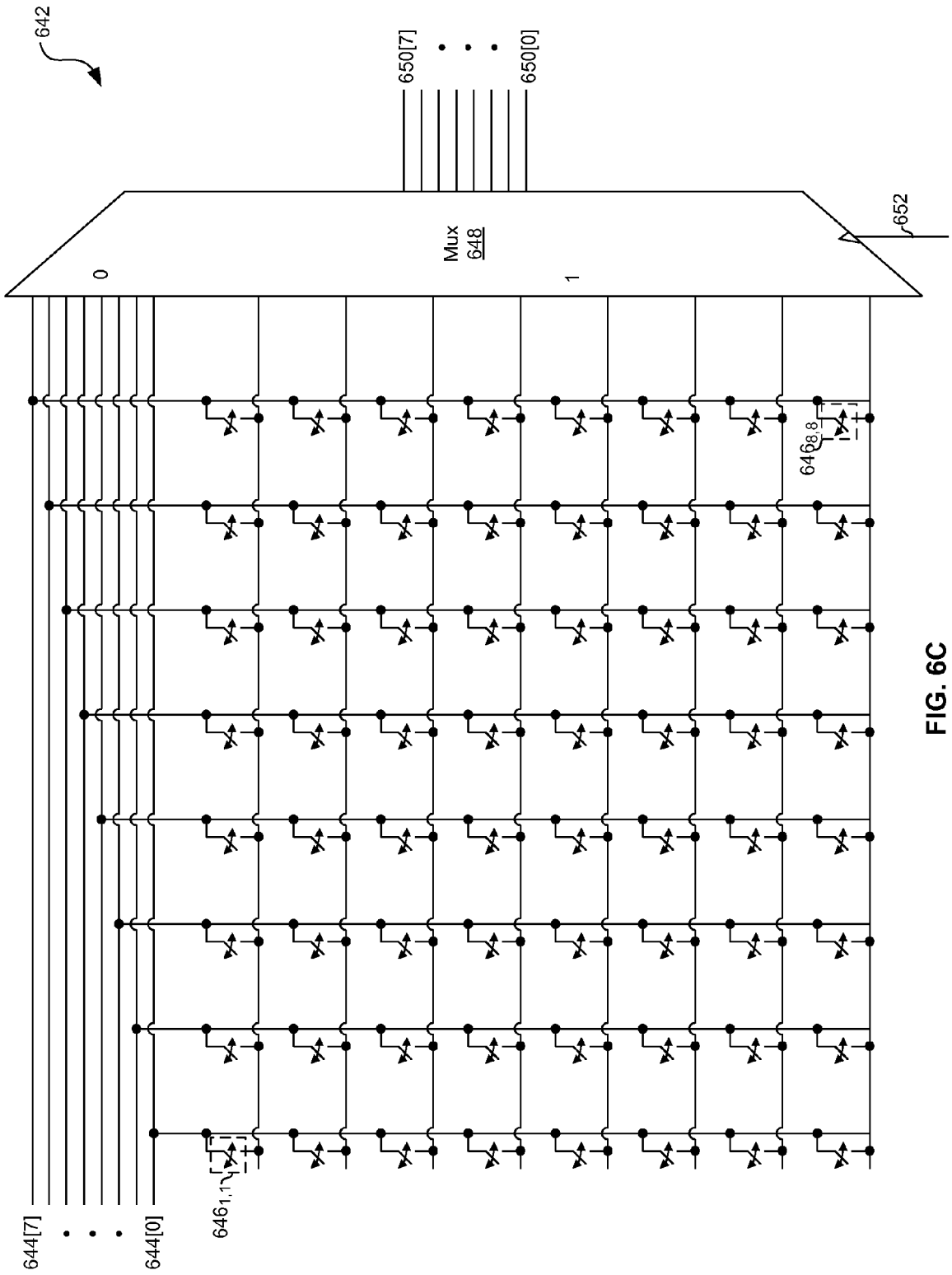
FIG. 6C depicts a configurable fault mitigation mapping module.

FIG. 6C depicts a system comprising a configurable fault mitigation mapping module. Referring to FIG. 6C, the configurable fault mitigation mapping module 640 comprises input lines 644[7:0], output lines 650[7:0], a multiplexer 648, a control signal 652, and sixty-four configuration elements 646$_{1,1}$-646$_{8,8}$. Although sixty-four configuration elements are utilized for illustration, the invention is not so limited.

Each of the configuration elements 646$_{1,1}$-646$_{8,8}$ may comprise, for example, an NMOS transistor, a PMOS transistor, a CMOS transmission gate, a fuse, an anti-fuse, or any other device for making and/or breaking a connection between signal traces. The configuration elements 646$_{1,1}$-646$_{8,8}$ may be one-time configurable, electronically configurable via a programming station, and/or dynamically configurable (e.g., by control signals from a processor such as the CPU 104) during operation of a device (e.g., receiver 150) in which the module 642 resides.

In operation, the module 642 may perform a first mapping when the signal 652 is logic 0 and may perform a second mapping when the signal 652 is logic 1.

In an exemplary embodiment where the module 642 is one-time programmable, the second mapping may be determined upon characterizing a particular memory that is to be utilized with the module 642. For example, the module may be paired with a memory 152 that has a faulty bit line [6] such that cell [6] of each row of the memory 152 is faulty. The module 642 may be programmed such that bit line [6] of the memory 152 is mapped to the one of the lines 644[7:0] that corresponds to the least significant bit of the data blocks that are written to the memory 152 via the module 642 (e.g., bit [0] of the data block 404).

In an exemplary embodiment the module 642 may be configured on a per memory, per-memory-instance, per-memory-address, and/or per-memory-array basis. For example, the configuration elements 642 may be placed into a first configuration when writing or reading memory from a first address of the memory 152 and may be placed into a second configuration when writing or reading from a second memory address of the memory 152.

The fault mitigation mapping modules depicted in FIGS. 6A-6C achieve different mappings via re-ordering of signal lines. In this manner, delay introduced by the multiplexers 608, 628, or 648 may be the only significant additional delay introduced by the fault mitigation mapping modules 602, 622, and 642, respectively. In other embodiments, however, the mapping may be achieved via one or more logic gates. Such other embodiments may be utilized, for example, when additional delay can be tolerated. In an embodiment of the invention, the mapping may be achieved by a permutation network such as, for example, a Benes permutation network.

Figure 7:
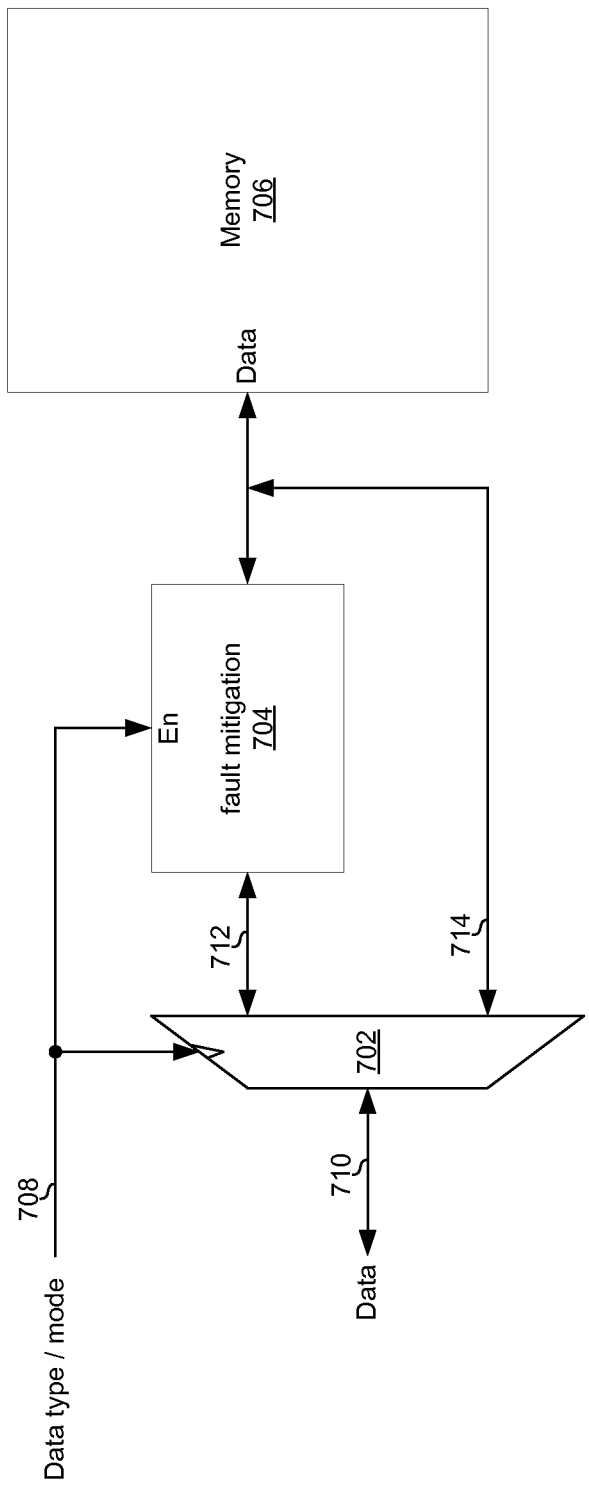
FIG. 7 depicts a system operable to enable and disable a memory fault mitigation module based on a type of data being written to or read from memory.

FIG. 7 depicts a system operable to enable and disable a memory fault mitigation module based on a type of data being written to or read from memory. Referring to FIG. 7, there is shown a multiplexer 702, a memory fault mitigation module 704, and a memory 706.

The multiplexer 702 may route the data bus 710 to the bus 712 when the data type/mode signal 708 is in a first state, and may route the data bus 710 to the bus 714 when the signal 708 is in a second state. The signal 708 may indicate a type of data on the bus 710 and/or a corresponding mode in which the electronic device is operating.

The memory fault mitigation module 704 may be substantially similar to, or the same as, one or more of the fault mitigation mapping modules 602, 622, or 642. The memory 706 may be substantially similar to, or the same as, the memory 200 described with respect to FIG. 2.

In an exemplary write operation, a data block to be written to the memory 706 may be placed on the data bus 710, and a value of the data type signal 708 may be set to indicate the data type of the data block. If the data block is of a first type, the multiplexer 702 may output the data to the memory fault mitigation block 704, where the data will be mapped to the data bus 714, which connects to the bit lines of the memory 706. If the data block is of a second type, the multiplexer 702 may output the data to the data bus 714, which connects to the bit lines of the memory 706. When the error mitigation module 704 is bypassed it may be disabled to save power.

Figure 8:
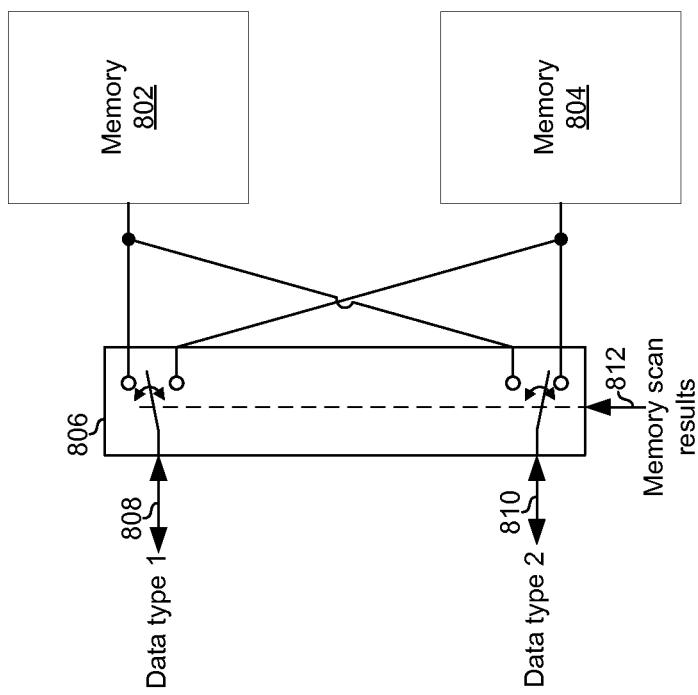
FIG. 8 depicts a system operable to allocate memory based on a characterization of the memory and the sensitivity of the data being written to or read from memory.

FIG. 8 depicts a system operable to allocate memory based on a characterization of the memory and the sensitivity of the data being written to or read from memory. Referring to FIG. 8, there is shown a switch 806, which connects data busses 808 and 810 to the memories 802 and 804. The bus 808 may carry a first data type and the bus 810 may carry a second data type.

In operation, the memories 802 and 804 may be scanned to determine how many faulty memory cells are in each of the memories 802 and 804 and/or where faulty memory cells are in the memory 802 and memory 804. Based on the result of the scan, and based on the error tolerance of data types 1 and 2, the switch 806 may be configured via the signal 812. For example, if data type 1 is more error-sensitive than data type 2 and memory 802 has fewer errors than memory 804, then bus 808 may be coupled to the memory 802. As another example, if data type 2 is more error-sensitive than data type 1 and memory 802 has fewer errors than memory 804, then bus 810 may be coupled to the memory 802.

Figure 9:
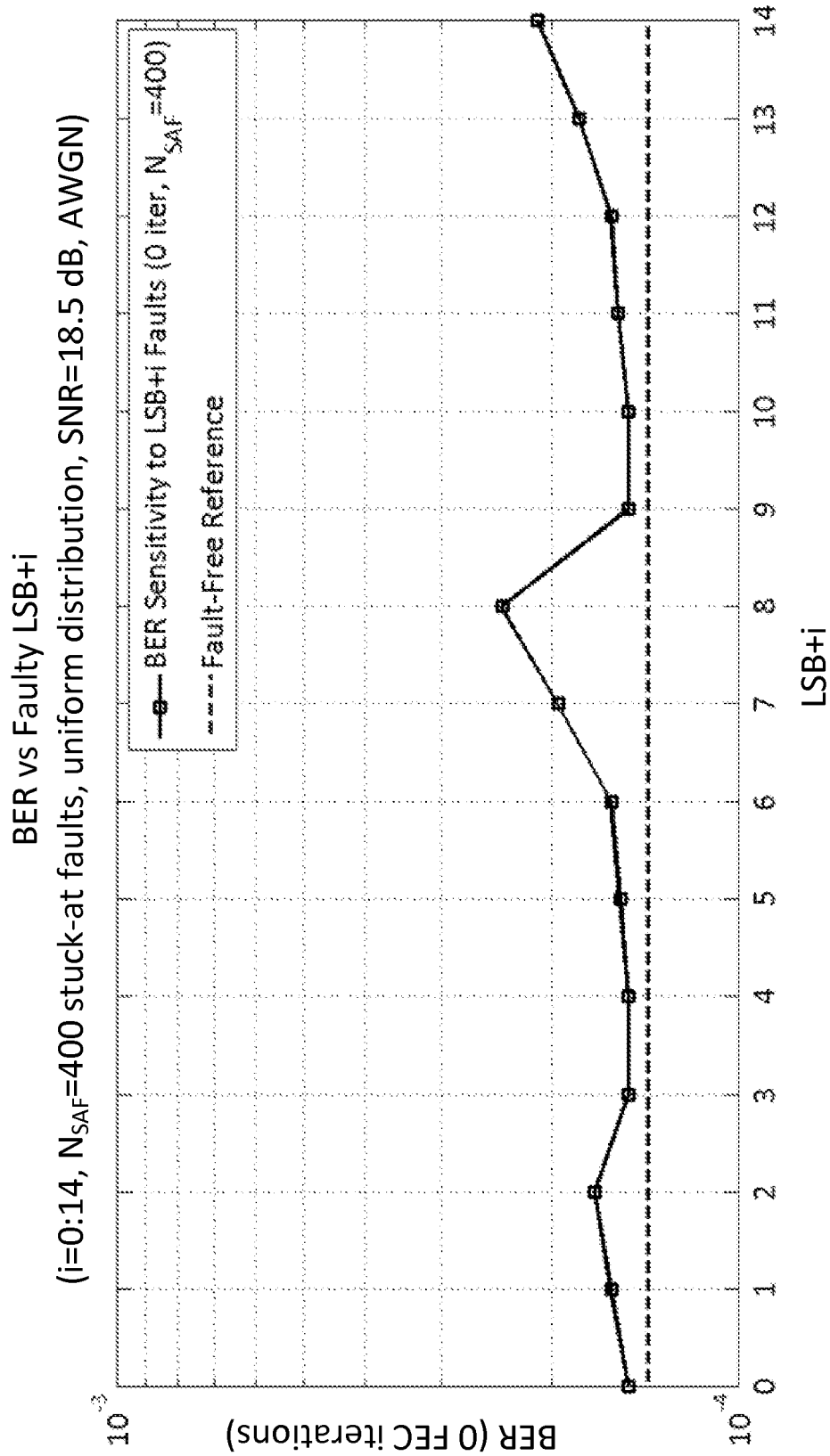
FIGS. 9 and 10 show simulation results of an exemplary implementation of a receiver utilizing aspects of the present invention.
Figure 10:
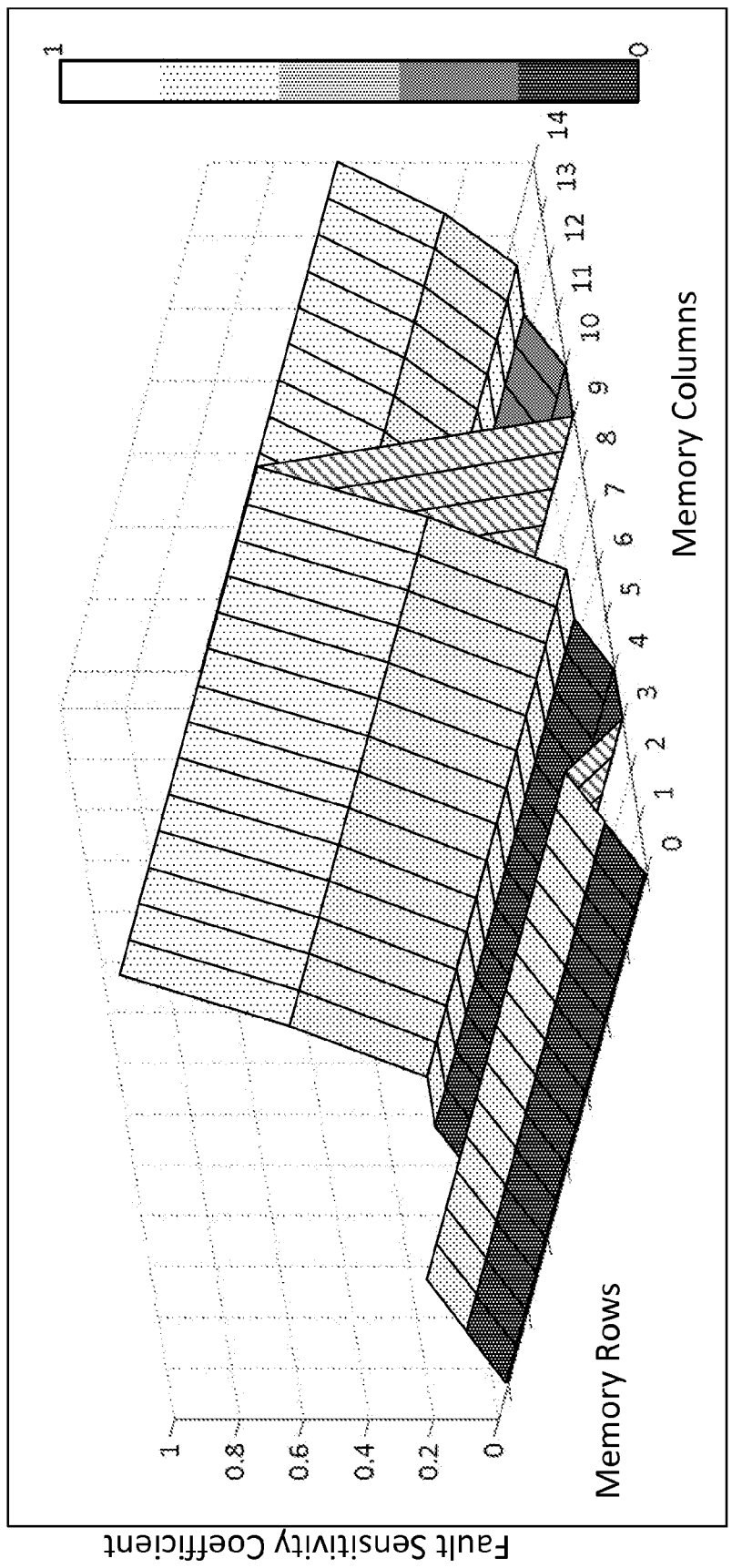

FIGS. 9 and 10 show simulation results of an exemplary implementation of the receiver 150. FIG. 9. shows the impact of $N_{SAF}$=400 stuck-at-faults (SAF) in the Frequency Time De-Interleaver (FTDI) memory 152 on the decoding performance of an exemplary implementation of receiver 150 with Forward Error Correction (FEC) as measured by the Bit Error Rate (BER). For the simulation shown in FIG. 9, the de-interleaver memory 152 stores soft symbol data. $N_{SAF}$=400 stuck-at-faults were uniformly distributed and mapped to each bit in a memory word, as follows: $N_{SAF}$ faults were first introduced in the MSB of the symbol data and the BER due to the faults was recorded; next, $N_{SAF}$ faults were introduced in the remaining symbol data and in each case the BER due to the faulty bit was recorded for a fixed SNR=18.5 dB and an Additive White Gaussian Noise (AWGN) channel with 0 FEC decoding iterations. The simulation was repeated for each cell in the de-interleaver memory word.

Stuck-at-Faults (SAF) typically account for more than 50% of memory array faults and therefore SAF can be used as a first order approximation to a faulty memory array. For the simulation, a larger than expected number of $N_{SAF}$=400 stuck-at-faults was selected to account for other types of faults not modeled in the simulation and to test the system under high fault conditions. For the simulation, by setting a sensitivity threshold to 1.6×10-4 BER, or 7% above the fault-free reference, the high sensitivity (MSB) region contains all faulty bits with BER greater than the 1.6×10-4 threshold. Similarly, for the simulation, the LSB region (i.e. low sensitivity region) of the same size contains all faulty bits with BER less than the 1.6×10-4 threshold. In the simulation, if a memory fault is found in the MSB region and no faults are found in the LSB region, the permutation of the MSB and LSB regions results in ASNR gain improvement compared to memory without repair.

Although, the receiver 150 utilizes aspects of the invention in combination with forward error correction techniques (i.e., Viterbi and Reed-Solomon encoding), aspects of the invention may improve system performance even without the use of additional error correction.

FIG. 10 shows a fault sensitivity coefficient for an exemplary Frequency Time De-Interleaver (FTDI) memory 152 due to stuck-at faults. FIG. 10 shows a fault sensitivity coefficient $\zeta$ for a section of the Frequency Time De-Interleaver (FTDI) memory based on the BER plot in FIG. 9. In the simulation, the FTDI memory columns store data symbols stored in memory rows. The fault sensitivity coefficient $\zeta$ was determined by taking the difference between the solid and dashed lines in FIG. 9, and then normalizing the difference to 1. The coefficient $\zeta$ may be calculated, for example, during manufacture of the memory 152 and/or may be calculated real-time while the device 150 is in operation (e.g., processing video). That is, the fault sensitivity coefficient of a particular memory cell may correspond to the difference in a system performance metric (e.g., BER) due to that memory cell being faulty as compared to that memory cell being functional. The simulation results show that the data bits that are closest to the MSB have a higher fault sensitivity coefficient compared to bits that are closest to the LSB. As a result of permutation of MSB and LSB regions, utilizing aspects of the invention achieves the fault sensitivity exhibited by the LSB region for MSB region data, whenever the MSB region has faults and the LSB region is fault-free.

In an exemplary embodiment of the invention, one or more circuits may comprise a multiplexer (e.g., multiplexer 608), a data bus (e.g., bus 302 and/or bus 316) comprising a plurality of data lines (e.g., 302[1:N] and/or 316[1:N]), and an array (e.g., array 400) of memory cells (e.g., memory cells 334) coupled to a plurality of bit lines (e.g., bit lines 336[1:N]). The plurality of data lines and the plurality of bit lines may be used to write to (e.g., lines 302[1:N]) and/or read from (e.g., lines 316[1:N]) the array of memory cells. The multiplexer may select among different mappings between the plurality of data lines and the plurality of bit lines. The array of memory cells may consist of N memory cells, the plurality of bit lines may consist of N bit lines, and the plurality of data lines may consist of N data lines, where N is an integer greater than 1. The configuration of the multiplexer may be controlled based, at least in part, on which, if any, of the plurality memory cells is faulty. For a write operation in which a data block (e.g., data block 404) is to be written to the array, a configuration of the multiplexer may be controlled based, at least in part, on how sensitive the data block is to a faulty memory cell among the array of memory cells. The one or more circuits may reside in a receiver (e.g., receiver 150) and perform operations on the received data such as, for example, time and/or frequency deinterleaving of received data.

In an exemplary embodiment, the array of memory cells may be one of a plurality of arrays (see e.g., FIG. 3C) of memory cells. A first mapping between the plurality of data lines and the plurality of bit lines may be utilized for a first one or more of the plurality of arrays. A second mapping of the plurality of data lines and the plurality of bit lines may be utilized for a second portion of the plurality of arrays. For example, a first mapping may map data lines 302[1:N] to bit lines 336[1:N], respectively, and a second mapping may map data lines 302[1:N] to bit lines 336 [N:1], respectively.

In an exemplary embodiment of the invention, the plurality of arrays may be utilized for storing multiple types of data blocks. A first one or more of the plurality of arrays may have less than a threshold number of faulty cells. A second one or more of the plurality of arrays may have more than the threshold number of faulty cells. The first one or more of the plurality of cells may be utilized for storing data blocks of a first type (e.g., operating system parameters). The second one or more of the plurality of cells may be utilized for storing data blocks of a second type (e.g., media data).

In an exemplary embodiment of the invention, one or more circuits may comprise an array of memory cells (e.g., a two or more of the cells $334_{1,1}$-$334_{M,N}$). The one or more circuits may be operable to discover a location of a faulty memory cell in the array of memory cells, the location being indexed, for example to a left-most cell of the array. The one or more circuits may be operable to arrange the order in which the bits of a data block (e.g., data block 404) are stored to the array based, at least in part, on the discovered location in the array of the faulty memory cell. The array of memory cells may consist of N memory cells, and the data block may consist of N data bits, where N is an integer greater than 1. The one or more circuits may be operable to discover, for the data block to be stored to the plurality of memory cells, how sensitive the data block is to an error in the bit location of the data block corresponding the location in the array of the faulty memory cell. For example, if the array is a single row of memory cells, and the faulty cell is the nth bit from the left of the array, the one or more circuits may discover how sensitive the data block is to an error at the nth bit from the left of the data block. The one or more circuits may be operable to arrange the order in which the bits of the data block are stored to the array based, at least in part, on the discovered sensitivity. The one or more circuits may be operable to process (e.g., deinterleave) a datastream. The one or more circuits may comprise a fault register (e.g., fault register 304) that stores an indication of the discovered location of the faulty memory cell.

In an exemplary embodiment of the invention, one or more circuits may comprise an array of memory cells (e.g., array 400) and a memory fault mitigation module (e.g., module $306_5$), and the one or more circuits may be operable to write a data block (e.g., data block 404) to the array. The write operation may comprise a swap of a first portion of the data block with a second portion of the data block. The swap may be in response to a detection that one or more memory cells of the array is faulty. The write operation may comprise, subsequent to the swap, storing the data block to the array of memory cells. The first portion of the data block 404 may be a more-significant one or more bits of the data block, and the second portion of the data block may be a less-significant one or more bits of the data block. The write operation may be performed as part of processing (e.g., frequency and/or time deinterleaving) a datastream.

In an exemplary embodiment of the invention, one or more circuits may comprise an array (e.g., array 400) of memory cells and a memory fault mitigation module (e.g., module $306_2$), and the one or more circuits may be operable to read a data block from the array of memory cells. The read operation may comprise retrieval of the bits stored in the array, and a swap of a first portion of the retrieved bits with a second portion of the retrieved bits. The swap may be in response to a detection that one or more memory cells of the array is faulty. The first portion of the retrieved bits may be a more-significant one or more bits of the data block, and the second portion of the retrieved bits may be a less-significant one or more bits of the data block. The read operation may be performed as part of a deinterleaving process.

In an exemplary embodiment of the invention, one or more circuits comprising an array of memory cells, may be operable to arrange bits of data to be written to the array of memory cells based on a sensitivity coefficient assigned to one or more cells of the array of memory cells, and write the arranged bits of data to the array of memory cells. A sensitivity coefficient of a cell of the array of memory cells may be determined by comparing the value of a performance metric (e.g., BER) measured for the cell being functional to the value of the performance metric measured for the cell being faulty.

In an exemplary embodiment of the invention, one or more circuits may comprise a fault register and an M-row by N-column block of memory cells, where each of M and N is configurable to be any integer greater than 1. The block of memory cells may be zoned into R sensitivity zones, where R is configurable to be any integer greater than 1. Each ceiling ($\log_2$ R) cells of the fault register may indicate the presence and/or location of errors in a corresponding i rows of the block of memory cells, where I is configurable to be any integer between 1 and M, inclusive. The size of the fault register may be configurable and equal to ceiling($\log_2$ R)×ceiling(M/i).

Other embodiments of the invention may provide a non-transitory machine-readable (e.g., computer-readable) medium and/or storage medium, having stored thereon, a machine code and/or a computer program having at least one code section executable by a machine and/or a computer, thereby causing the machine and/or computer to perform the steps as described herein for memory fault tolerance.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
one or more circuits comprising an array of non-redundant memory cells corresponding to a particular memory address, said one or more circuits being operable to:
discover a location of a faulty memory cell in said array of memory cells; and
arrange the order in which the bits of a data block are stored to said array of memory cells based, at least in part, on said discovered location of said faulty memory cell, wherein said arrangement is such that:
when said discovered location is a first location, said bits of said data block are stored to said array of memory cells in descending order from most-significant bit to least-significant bit; and
when said discovered location is a second location, said bits of said data block are stored to said array of memory cells in ascending order from most-significant bit to least-significant bit.

2. The system of claim 1, wherein:
said array of memory cells consists of N memory cells;
said data block consists of N data bits; and
N is an integer greater than 1.

3. The system of claim 1, wherein said one or more circuits are operable to:
discover, for said data block to be stored to said array of memory cells, how sensitive said data block is to an error at a bit location of said data block corresponding to said location of said faulty memory cell in said array of memory cells; and
arrange the order in which said bits of said data block are stored to said array of memory cells based, at least in part, on said discovered sensitivity.

4. The system of claim 1, wherein said one or more circuits are operable to process a datastream.

5. The system of claim 4, wherein said processing of said datastream comprises deinterleaving said datastream.

6. The system of claim 1, wherein said one or more circuits comprise a fault register that stores an indication of said discovered location of said faulty memory cell.

7. The system of claim 1, wherein said one or more circuits comprise a multiplexer operable to perform said arrangement.

8. A system comprising:
one or more circuits comprising an array of non-redundant single-level memory cells, said one or more circuits being operable to:
arrange bits of data to be written to said array of non-redundant single-level memory cells based on a sensitivity coefficient assigned to one or more cells of said array of non-redundant single-level memory cells, wherein:
when said discovered location is a first location, said arranged bits of data are in descending order from most-significant bit to least-significant bit; and
when said discovered location is a second location, said arranged bits of data in ascending order from most-significant bit to least-significant bit; and
write said arranged bits of data to said array of non-redundant single-level memory cells.

9. The system of claim 8, wherein a sensitivity coefficient of a cell of said array of non-redundant single-level memory cells is determined by comparing the value of a performance metric measured when said cell is functional to the value of said performance metric measured when said cell is faulty.

10. The system of claim 8, wherein said one or more circuits comprise a multiplexer operable to perform said arrangement.

* * * * *